United States Patent
Yamada et al.

(10) Patent No.: US 10,811,790 B2
(45) Date of Patent: Oct. 20, 2020

(54) NOISE FILTER AND WIRE HARNESS

(71) Applicant: Yazaki Corporation, Tokyo (JP)

(72) Inventors: Kunihiko Yamada, Shizuoka (JP);
Masashi Tsukamoto, Shizuoka (JP);
Ryoma Toyoda, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/454,964

(22) Filed: Jun. 27, 2019

(65) Prior Publication Data
US 2020/0014132 A1  Jan. 9, 2020

(30) Foreign Application Priority Data

Jul. 4, 2018  (JP) .................................. 2018-127818

(51) Int. Cl.
| H01R 13/66 | (2006.01) |
| H01R 4/48 | (2006.01) |
| H01B 7/00 | (2006.01) |
| H01R 4/60 | (2006.01) |
| H03H 1/00 | (2006.01) |

(52) U.S. Cl.
CPC ............. *H01R 4/48* (2013.01); *H01B 7/0045* (2013.01); *H01R 4/60* (2013.01); *H03H 1/00* (2013.01)

(58) Field of Classification Search
CPC .......................... H01R 13/719; H01R 13/7193
USPC ........................................ 439/620.05, 620.21
See application file for complete search history.

(56) References Cited

U.S. PATENT DOCUMENTS

| 5,091,707 A | * | 2/1992 | Wollmerschauser | .. H04B 15/02 333/12 |
| 5,577,937 A | * | 11/1996 | Itoh | ..................... H01R 13/6625 439/620.22 |
| 5,846,098 A | | 12/1998 | Shiga et al. | |
| 6,109,971 A | * | 8/2000 | Vadlakonda | ....... H01R 13/6597 439/607.01 |
| 6,297,447 B1 | * | 10/2001 | Burnett | ................ H01R 9/0524 174/40 CC |

(Continued)

FOREIGN PATENT DOCUMENTS

| EP | 0 991 139 A1 | 4/2000 |
| JP | 2000-133333 A | 5/2000 |

(Continued)

*Primary Examiner* — Neil Abrams
(74) *Attorney, Agent, or Firm* — Kenealy Vaidya LLP

(57) ABSTRACT

A noise filter includes a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected, and an electric connection structure that electrically connects an intermediate connection portion of a core wire of an electric wire to one of the first circuit connection member and the second circuit connection member. The electric connection structure includes a circuit side connection body provided in one of the first circuit connection member and the second circuit connection member and indirectly or directly electrically connected to the intermediate connection portion by an elastic force indirectly or directly exerted on the intermediate connection portion.

7 Claims, 20 Drawing Sheets

(56) References Cited

U.S. PATENT DOCUMENTS

| | | | | |
|---|---|---|---|---|
| 6,623,275 B1 * | 9/2003 | Pavlovic | H01R 13/7197 | 439/38 |
| 7,081,018 B2 * | 7/2006 | Nagaoka | H01R 4/2429 | 333/182 |
| 7,470,151 B2 * | 12/2008 | Yamaguchi | H01R 4/185 | 439/417 |
| 7,614,917 B2 * | 11/2009 | Yamaguchi | H01R 4/185 | 439/417 |
| 7,648,397 B2 * | 1/2010 | Shimizu | H05K 5/0091 | 439/620.21 |
| 7,744,425 B2 * | 6/2010 | Shimizu | H02G 3/081 | 439/658 |
| 7,833,061 B2 * | 11/2010 | Hori | H01R 13/7195 | 439/620.21 |
| 7,874,851 B2 * | 1/2011 | Shimizu | H01R 4/34 | 439/620.21 |
| 7,961,065 B2 * | 6/2011 | Kobayashi | H01F 17/045 | 333/172 |
| 8,105,103 B2 * | 1/2012 | Nishio | H01R 4/305 | 439/287 |
| 8,492,663 B2 * | 7/2013 | Nishiyama | H02G 3/086 | 174/545 |
| 8,861,225 B2 * | 10/2014 | Kodama | H01G 2/106 | 361/782 |
| 8,973,879 B2 * | 3/2015 | Kodama | H02G 3/32 | 24/293 |
| 9,362,881 B2 * | 6/2016 | Aizawa | H03H 1/0007 | |
| 9,960,745 B2 * | 5/2018 | Itou | H01B 7/0045 | |
| 10,355,418 B2 * | 7/2019 | Iizuka | H01F 17/062 | |
| 10,461,442 B2 * | 10/2019 | Takasaki | H01R 4/2429 | |
| 10,707,628 B2 * | 7/2020 | Iizuka | H01F 27/027 | |
| 2009/0167461 A1 | 7/2009 | Oiwa et al. | | |
| 2015/0294783 A1 * | 10/2015 | Furukawa | H03H 7/09 | 174/72 A |

FOREIGN PATENT DOCUMENTS

| | | |
|---|---|---|
| JP | 2007-311630 A | 11/2007 |
| JP | 2012-39201 A | 2/2012 |
| JP | 2014-189110 A | 10/2014 |

* cited by examiner

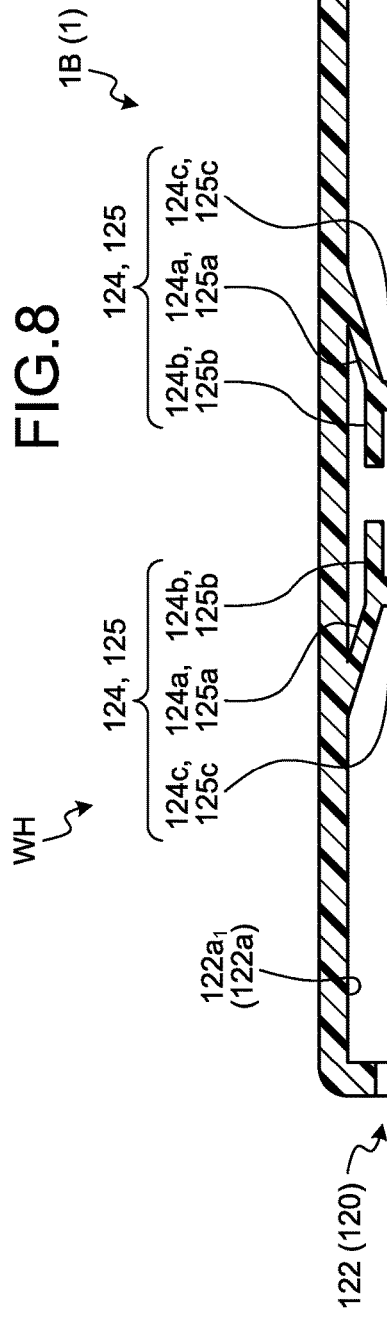
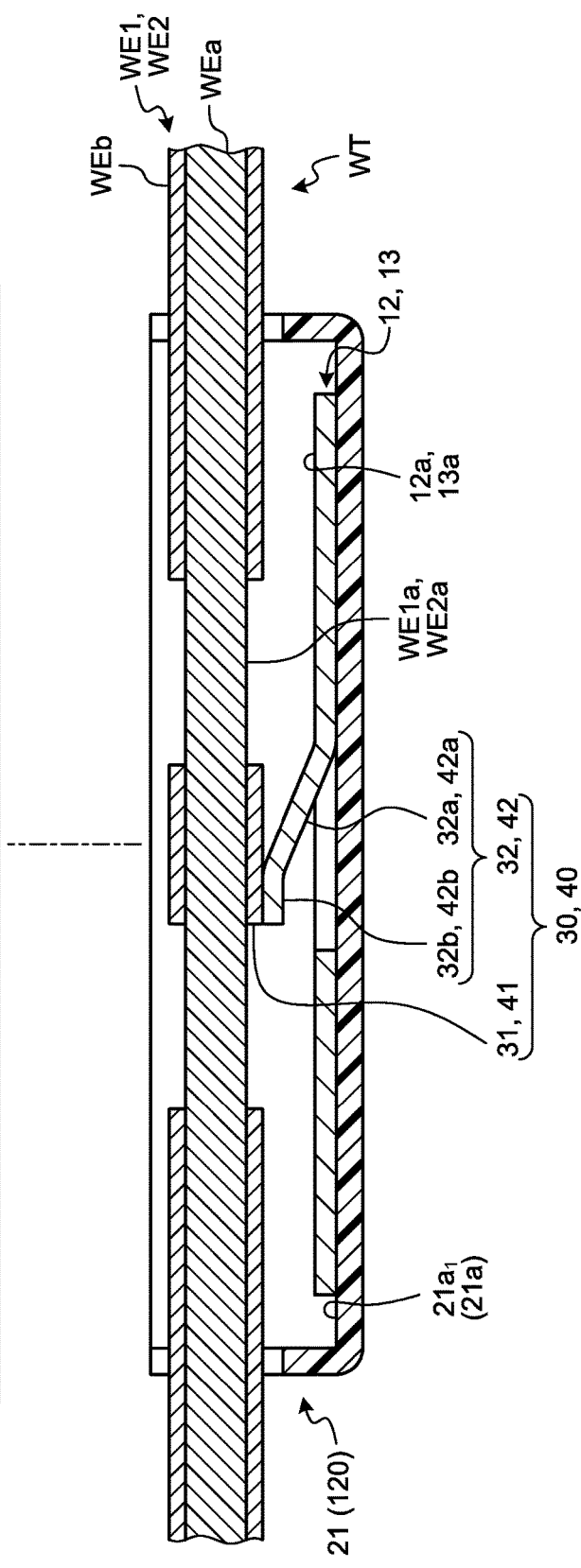
FIG.8

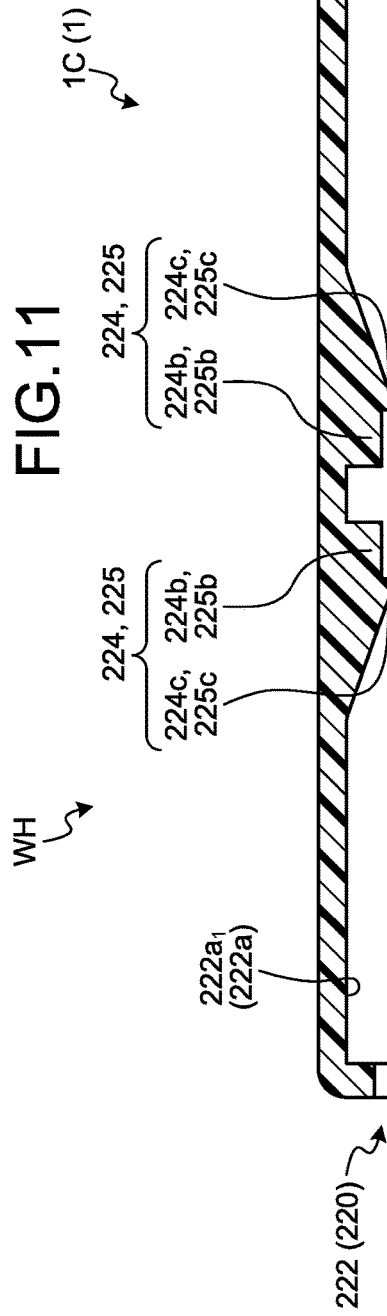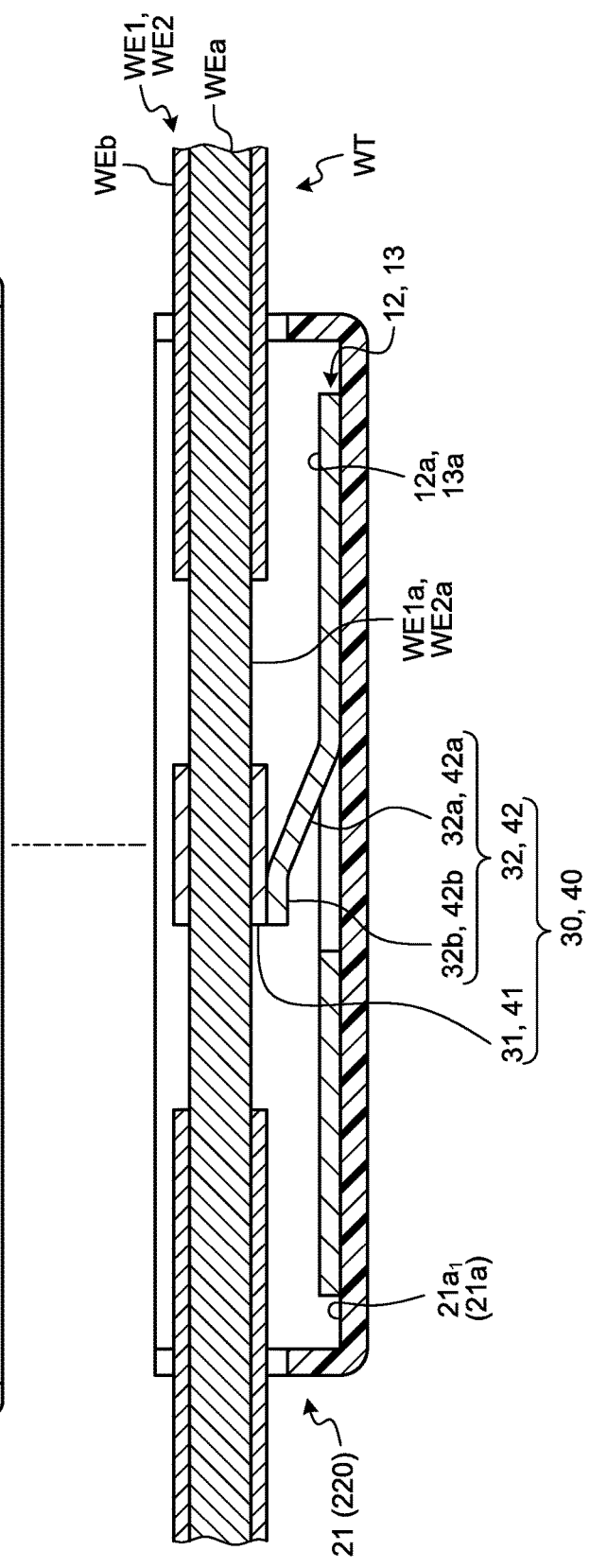
FIG.11

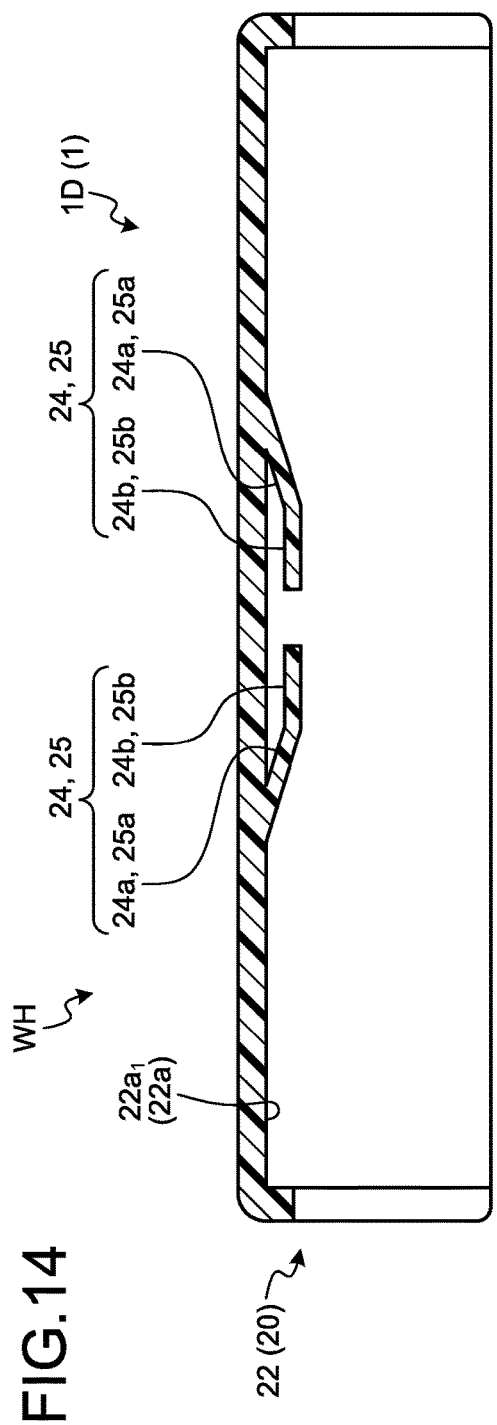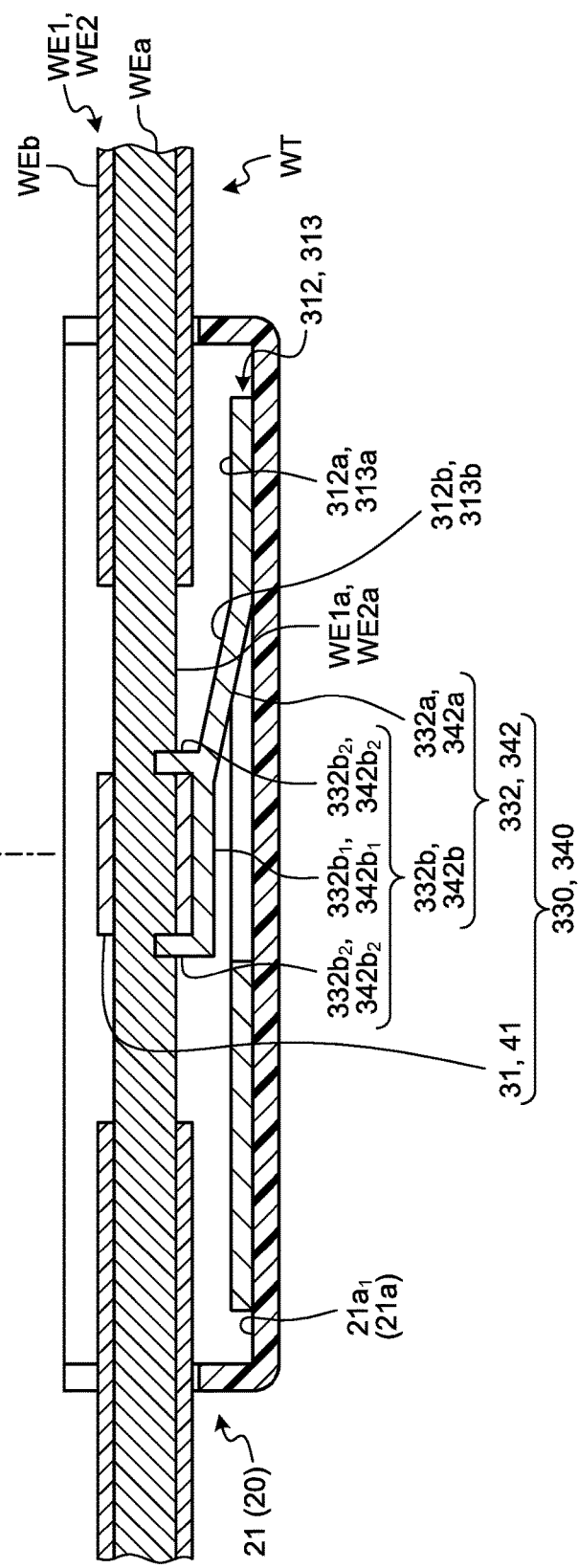
FIG.14

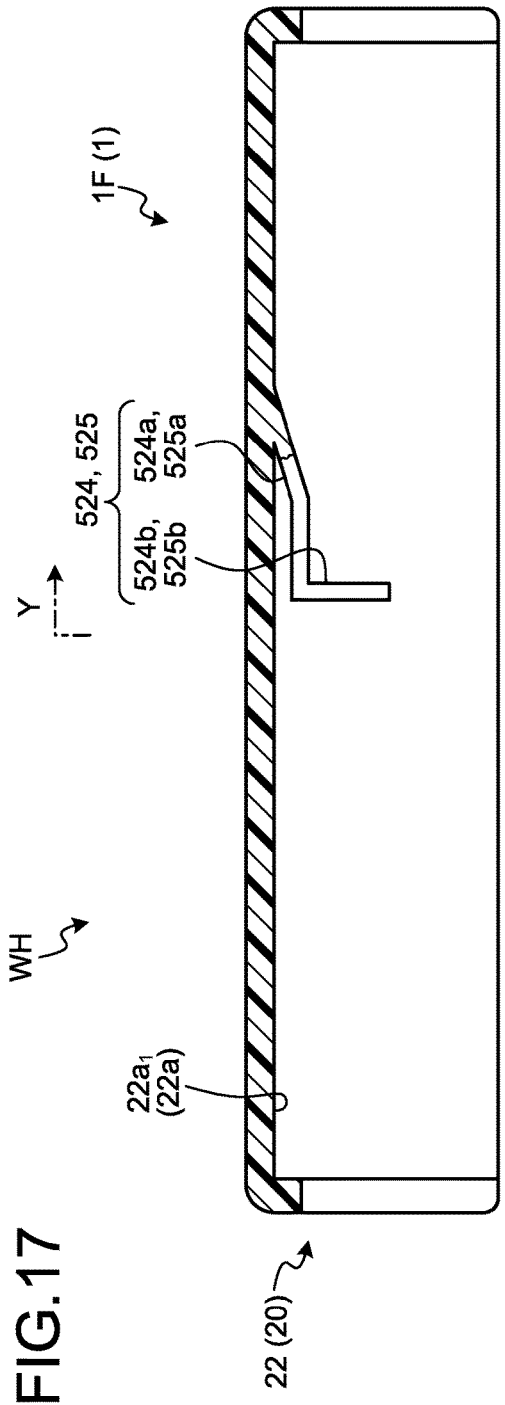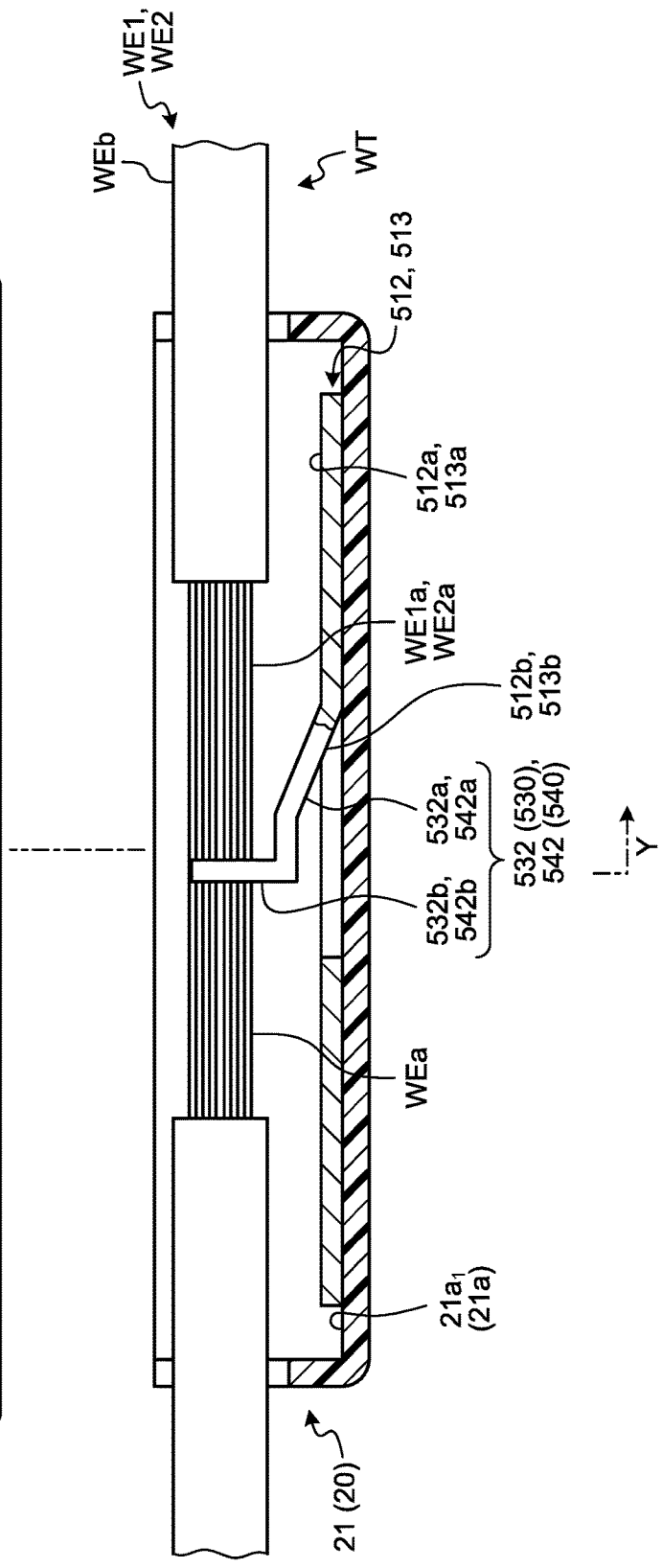
FIG.17

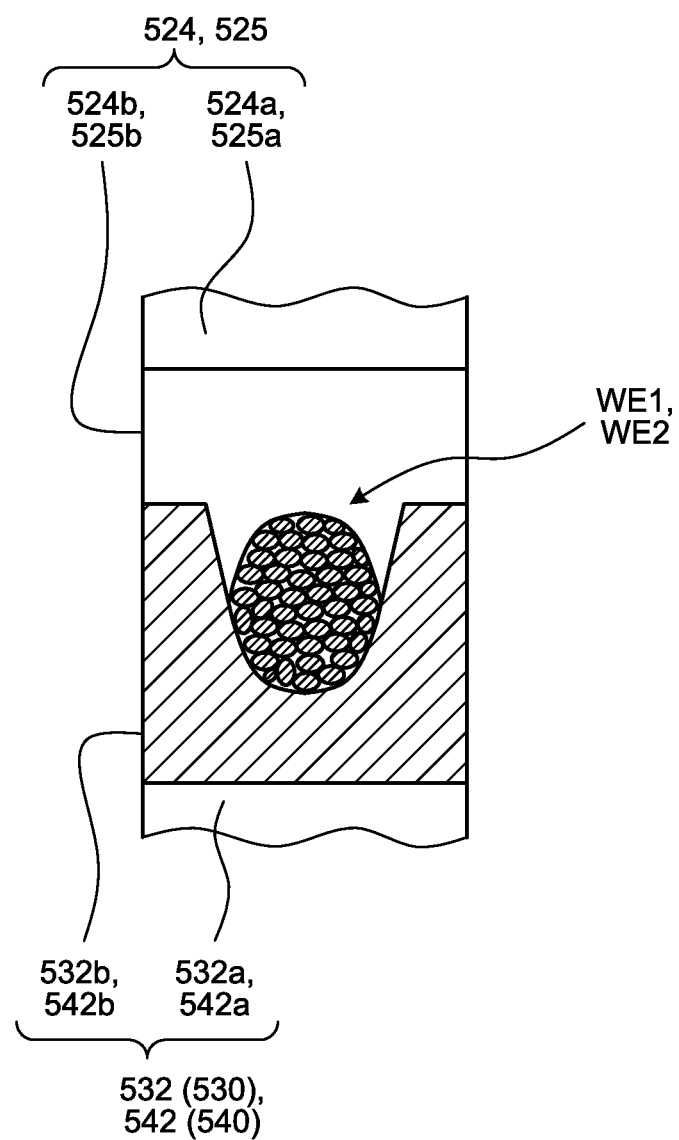

NOISE FILTER AND WIRE HARNESS

CROSS-REFERENCE TO RELATED APPLICATION(S)

The present application claims priority to and incorporates by reference the entire contents of Japanese Patent Application No. 2018-127818 filed in Japan on Jul. 4, 2018.

BACKGROUND OF THE INVENTION

1. Field of the Invention

The present invention relates to a noise filter and a wire harness.

2. Description of the Related Art

Conventionally, there has been a known technology for placing a noise filter on a noise reduction target electric wire to reduce electric noise on the electric wire. The noise filter includes a filter circuit provided with a noise reduction element such as a capacitor, and the filter circuit is interposed between the noise reduction target electric wire and a ground terminal. This type of noise filter is disclosed in, for example, Japanese Patent Application Laid-open No. 2012-039201.

Incidentally, in the conventional noise filter, the other terminal fitting crimped to a terminal of an electric wire such as a noise reduction target electric wire is connected to a terminal fitting installed on the filter circuit side. Each of the terminal fitting and the other terminal fitting includes a terminal portion, and the filter circuit and the electric wire are electrically connected to each other by inserting and fitting one female terminal portion and the other male terminal portion to each other. A connection structure of the terminal fitting and the other terminal fitting needs to have a mechanism for keeping a mutual fitting state, and there is a limit on a reduction in size thereof. Therefore, the conventional noise filter has room for improvement in attempting a reduction in size of a frame.

SUMMARY OF THE INVENTION

Therefore, an object of the invention is to provide a noise filter and a wire harness capable of attempting a reduction in size of a frame.

In order to achieve the above mentioned object, a noise filter according to one aspect of the present invention includes a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected; and an electric connection structure that electrically connects an intermediate connection portion of a core wire of an electric wire to one of the first circuit connection member and the second circuit connection member, wherein the electric connection structure includes a circuit side connection body provided in one of the first circuit connection member and the second circuit connection member and indirectly or directly electrically connected to the intermediate connection portion of the core wire of the electric wire by an elastic force indirectly or directly exerted on the intermediate connection portion of the core wire of the electric wire.

According to another aspect of the present invention, in the noise filter, it is desirable to further include a housing that accommodates the filter circuit, the intermediate connection portion of the core wire of the electric wire, and the electric connection structure, wherein the housing has a clamping body that indirectly or directly clamps the intermediate connection portion of the core wire of the electric wire between the circuit side connection body and the clamping body.

According to still another aspect of the present invention, in the noise filter, it is desirable that the electric connection structure includes an electric wire side connection body physically and electrically connected to the intermediate connection portion of the core wire of the electric wire, and the circuit side connection body is formed to be indirectly electrically connected to the intermediate connection portion of the core wire of the electric wire by an elastic force exerted on the electric wire side connection body.

According to still another aspect of the present invention, in the noise filter, it is desirable that the intermediate connection portion of the core wire of the electric wire is a part obtained by collectively fixing a plurality of strands forming the core wire of the electric wire, and the circuit side connection body is formed to be directly electrically connected to the intermediate connection portion by an elastic force exerted on the intermediate connection portion of the core wire of the electric wire.

In order to achieve the above mentioned object, a wire harness according to still another aspect of the present invention includes a trunk line including an electric wire; and a noise filter that reduces a noise component, wherein the noise filter includes a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected, and an electric connection structure that electrically connects an intermediate connection portion of a core wire of the electric wire to one of the first circuit connection member and the second circuit connection member, and the electric connection structure includes a circuit side connection body provided in one of the first circuit connection member and the second circuit connection member and indirectly or directly electrically connected to the intermediate connection portion of the core wire of the electric wire by an elastic force indirectly or directly exerted on the intermediate connection portion of the core wire of the electric wire.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 8 is an exploded perspective view illustrating a first modification of the noise filter and the wire harness of the embodiment;

FIG. 11 is an exploded perspective view illustrating a second modification of the noise filter and the wire harness of the embodiment;

FIG. 14 is a perspective view illustrating a fourth modification of the noise filter and the wire harness of the embodiment;

FIG. 17 is an exploded perspective view illustrating a sixth modification of the noise filter and the wire harness of the embodiment;

FIG. 20 is a cross-sectional view taken along Y-Y line of FIG. 18.

DETAILED DESCRIPTION OF THE PREFERRED EMBODIMENTS

Hereinafter, an embodiment of a noise filter and a wire harness according to the invention will be described in detail based on drawings. The invention is not limited by this embodiment.

Embodiment

One embodiment of the noise filter and the wire harness according to the invention will be described based on FIG. 1 to FIG. 20.

Figure 1:
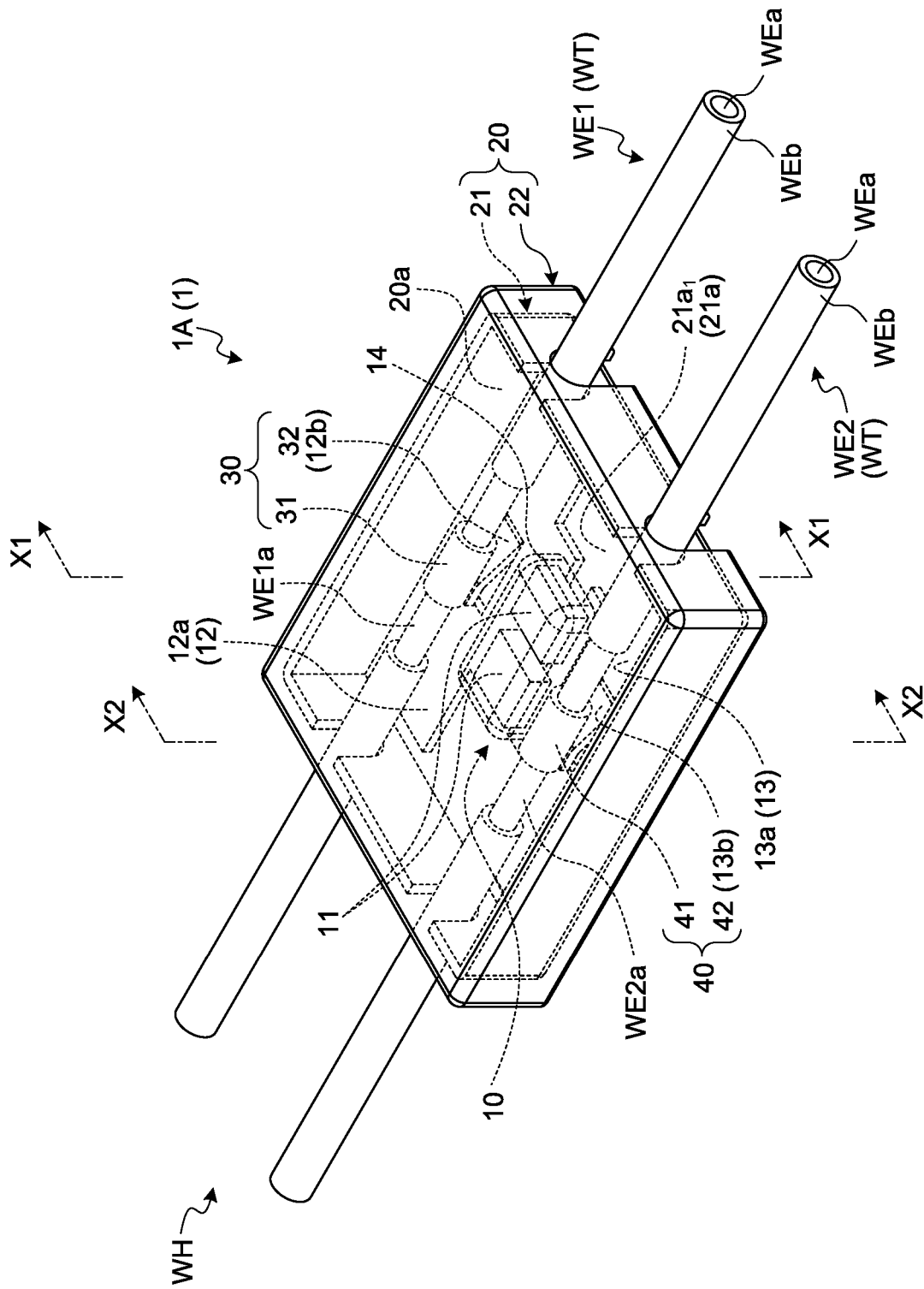
FIG. 1 is a perspective view illustrating a noise filter and a wire harness of an embodiment.
Figure 2:
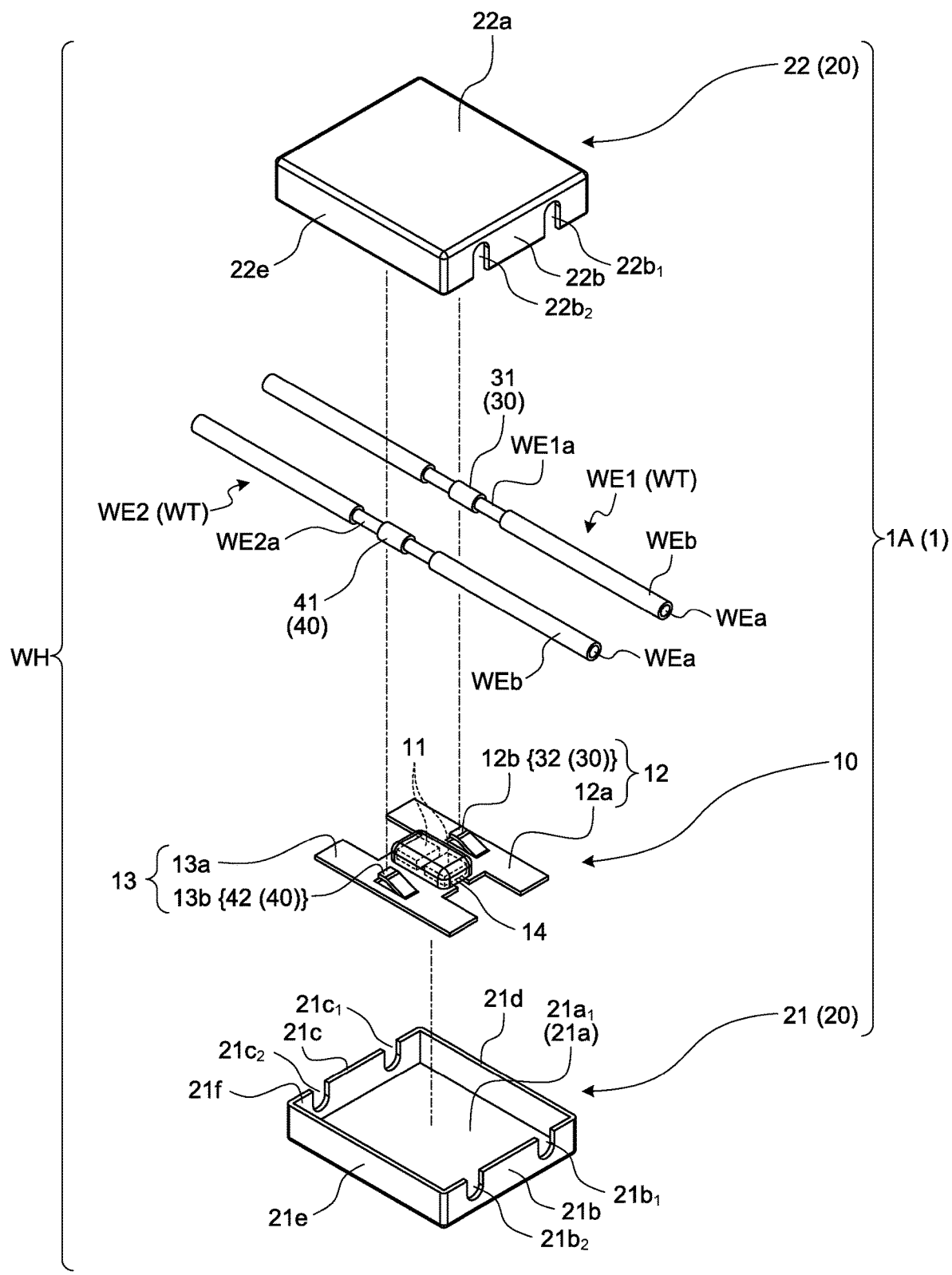
FIG. 2 is an exploded perspective view illustrating the noise filter and the wire harness of the embodiment.
Figure 3:
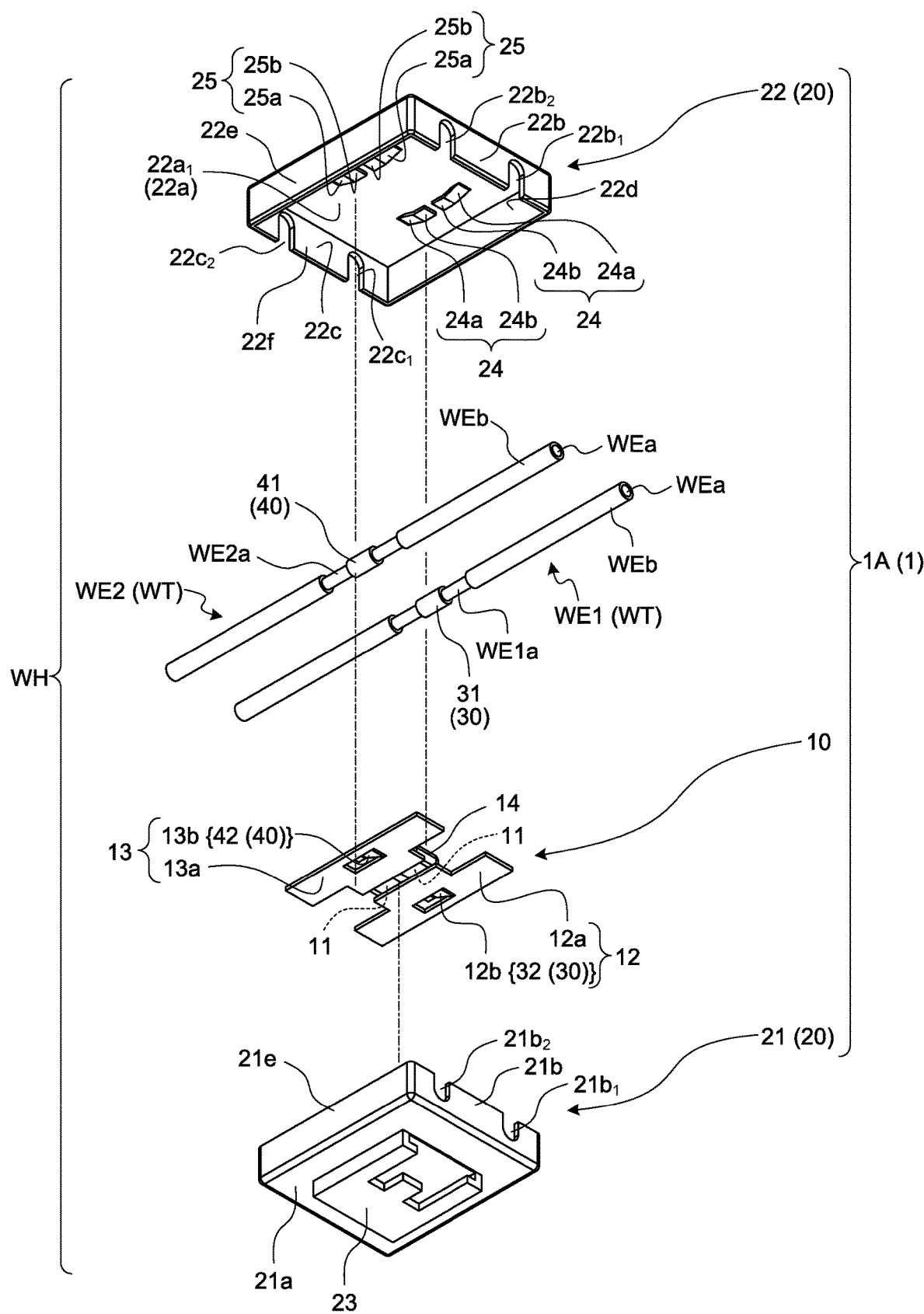
FIG. 3 is an exploded perspective view of the noise filter and the wire harness of the embodiment as viewed from a different angle.

Reference symbol 1 of FIG. 1 to FIG. 3 denotes the noise filter of the present embodiment. The noise filter 1 is a noise reduction device in which intermediate portions of two electric wires (first electric wire WE1 and second electric wire WE2) are connected by a filter circuit. One of the two electric wires is grounded, and an electric noise component on the other electric wire is reduced by the filter circuit. For example, the two electric wires correspond to two of a plurality of electric wires included in a trunk line WT of a wire harness WH of a vehicle. One electric wire is grounded as an earth wire, and the other electric wire is used as a power supply wire. For example, a load such as a defogger or a high mount stop lamp is electrically connected to the power supply line. The noise filter 1 becomes one component of the wire harness WH by being connected to the two electric wires. In the wire harness WH illustrated below, a first electric wire WE1 is used as a power supply wire, and a second electric wire WE2 is used as an earth wire. One end of the first electric wire WE1 is electrically connected to a power supply (for example, a secondary battery of the vehicle), and the other end thereof is electrically connected to the load. Further, one end of the second electric wire WE2 is grounded. Each of the first electric wire WE1 and the second electric wire WE2 includes a conductive core wire WEa and an insulating coating WEb covering an outer peripheral surface of the core wire WEa.

Noise Filter 1A

In the following, a noise filter 1A as an example of the noise filter 1 will be described (FIG. 1 to FIG. 3).

The noise filter 1A is a noise reduction device including a filter circuit 10 that reduces a noise component (FIG. 1 to FIG. 3). For example, the filter circuit 10 reduces an electrical noise component on the first electric wire WE1.

The filter circuit 10 is interposed between a portion of the core wire WEa located in an intermediate portion of the first electric wire WE1 and a portion of the core wire WEa located in an intermediate portion of the second electric wire WE2, and is electrically connected to each core wire WEa. Hereinafter, the portion of the core wire WEa located in the intermediate portion of the first electric wire WE1 will be referred to as an "intermediate connection portion WE1a", and the portion of the core wire WEa located in the intermediate portion of the second electric wire WE2 will be referred to as an "intermediate connection portion WE2a". In addition, in the following, the intermediate connection portion WE1a of the core wire WEa of the first electric wire WE1 will be simplified as the "intermediate connection portion WE1a of the first electric wire WE1", and the intermediate connection portion WE2a of the core wire WEa of the second electric wire WE2 will be simplified as the "intermediate connection portion WE2a of the second electric wire WE2".

The filter circuit 10 is interposed between the intermediate connection portion WE1a of the first electric wire WE1 and the intermediate connection portion WE2a of the second electric wire WE2 and is electrically connected to the respective intermediate connection portions WE1a and WE2a (FIG. 1).

The filter circuit 10 includes at least one noise reduction element 11 for reducing a noise component, a conductive first connection member (hereinafter referred to as a "first circuit connection member") 12 to which a first connection portion (hereinafter referred to as a "first element connection portion") of the noise reduction element 11 is electrically connected, and a conductive second connection member (hereinafter referred to as a "second circuit connection member") 13 to which a second connection portion (hereinafter referred to as a "second element connection portion") of the noise reduction element 11 is electrically connected (FIG. 1 to FIG. 3). Illustration of the first element connection portion and the second element connection portion is omitted.

Any noise reduction element 11 may be used as long as noise reduction can be achieved by this circuit configuration of the noise filter 1A. For example, as the noise reduction element 11, a capacitor, a coil, etc. can be considered. In this filter circuit 10, two capacitors are provided as the noise reduction element 11, and these two capacitors are configured to be able to reduce noise (FIG. 1 to FIG. 3).

The first circuit connection member 12 and the second circuit connection member 13 are conductive members that electrically connect each other through the noise reduction element 11. Each of the first circuit connection member 12 and second circuit connection member 13 in this example is molded as a plate-shaped bus bar using a conductive material such as metal.

The first circuit connection member 12 and the second circuit connection member 13 have flat plate-shaped main bodies 12a and 13a, respectively (FIG. 1 to FIG. 3). In the filter circuit 10, the first circuit connection member 12 and the second circuit connection member 13 are arranged side by side so that the main bodies 12a and 13a are disposed on the same plane. Further, in the filter circuit 10, the first element connection portion of the noise reduction element 11 is physically and electrically connected to the main body 12a of the first circuit connection member 12, and the second element connection portion of the noise reduction element 11 is physically and electrically connected to the main body 13a of the second circuit connection member 13. As a connection form, for example, welding, soldering, etc. is applied in accordance with a form of the first element connection portion or the second element connection portion of the noise reduction element 11.

The first circuit connection member 12 has a first circuit side connection body 12b which is indirectly electrically connected to the intermediate connection portion WE1a of the first electric wire WE1 (FIG. 1 to FIG. 3). The first circuit side connection body 12b is a component of a first electric connection structure 30 as described below. In addition, the second circuit connection member 13 has a second circuit side connection body 13b which is indirectly electrically connected to the intermediate connection portion WE2a of the second electric wire WE2 (FIG. 1 to FIG. 3). The second circuit side connection body 13b is a component of a second electric connection structure 40 as described below.

In the filter circuit 10 of this example, the two noise reduction elements 11 are covered with an insulating mold body 14 (FIG. 1 to FIG. 3). The mold body 14 is a solidified material of a molding agent injected between the two noise reduction elements 11 and the main body 12a of the first circuit connection member 12 and the main body 13a of the second circuit connection member 13, and covers a connection part between the two noise reduction elements 11 and main body 12a and a connection part between the two noise reduction elements 11 and the main body 13a.

Further, the noise filter 1A accommodates the filter circuit 10, the intermediate connection portion WE1a of the first electric wire WE1, and the intermediate connection portion WE2a of the second electric wire WE2 in an inner accommodation chamber 20a (FIG. 1), and includes a housing 20 that draws the respective end sides of the first electric wire WE1 outward from the inner accommodation chamber 20a and draws the respective end sides of the second electric wire WE2 outward from the inner accommodation chamber 20a (FIG. 1 to FIG. 3). The housing 20 is molded using an insulating material such as a synthetic resin. The housing 20 forms the accommodation chamber 20a by fitting a first housing member 21 and a second housing member 22 to each other.

The first housing member 21 has a main wall body 21a on which the filter circuit 10 is installed on an inner wall surface $21a_1$, and peripheral wall bodies 21b to 21e erected from a peripheral edge portion of the main wall body 21a (FIG. 2). The first housing member 21 in this example has the rectangular flat plate-shaped main wall body 21a and the flat plate-shaped first to fourth peripheral wall bodies 21b to 21e suspended from four sides of the main wall body 21a. The first housing member 21 has an opening 21f including edges of the first to fourth peripheral wall bodies 21b to 21e.

The first circuit connection member 12 and the second circuit connection member 13 are installed on the inner wall surface $21a_1$ side of the main wall body 21a of the first housing member 21 (FIG. 1 and FIG. 2).

For example, the first circuit connection member 12 and the second circuit connection member 13 place wall surfaces of the main bodies 12a and 13a, respectively, on the inner wall surface $21a_1$ of the main wall body 21a, and fix the wall surfaces onto the inner wall surface $21a_1$ using engaging mechanisms (not illustrated). For example, the engaging mechanism refers to a lock mechanism that holds the main body using a locking portion such as a claw provided at a plurality of positions on the inner wall surface $21a_1$ of the main wall body 21a. In addition, here, the first circuit connection member 12 and the second circuit connection member 13 may be installed on the inner wall surface $21a_1$ side of the main wall body 21a of the first housing member 21 by integrally molding the first housing member 21 with respect to the first circuit connection member 12 and the second circuit connection member 13. In this case, in the main bodies 12a and 13a of the first circuit connection member 12 and the second circuit connection member 13, the wall surfaces are exposed on the inner wall surface $21a_1$ side of the main wall body 21a of the first housing member 21.

The second housing member 22 has a main wall body 22a disposed to face the inner wall surface $21a_1$ of the main wall body 21a of the first housing member 21 at an interval, and blocks the opening of the first housing member 21. The second housing member 22 in this example further has peripheral wall bodies 22b to 22e erected from a peripheral edge portion of the main wall body 22a (FIG. 3). Here, the second housing member 22 has the rectangular flat plate-shaped main wall body 22a and the flat plate-shaped first to fourth peripheral wall bodies 22b to 22e suspended from four sides of the main wall body 22a, respectively. The second housing member 22 has an opening 22f including edges of the first to fourth peripheral wall bodies 22b to 22e.

In the housing 20 in this example, the first peripheral wall bodies 21b and 22b of the first housing member 21 and the second housing member 22 are disposed to face each other, the second peripheral wall bodies 21c and 22c thereof are disposed to face each other, the third peripheral wall bodies 21d and 22d thereof are disposed to face each other, and the fourth peripheral wall bodies 21e and 22e thereof are disposed to face each other.

The housing 20 in this example accommodates the first electric wire WE1 and the second electric wire WE2 in the accommodation chamber 20a in a parallel arrangement state, and causes the first electric wire WE1 and the second electric wire WE2 to run in parallel in the accommodation chamber 20a. In the housing 20, the first electric wire WE1 and the second electric wire WE2 are drawn outward from the first peripheral wall body 21b and the second peripheral wall body 21c in a facing arrangement state in the first housing member 21 and the first peripheral wall body 22b and the second peripheral wall body 22c in a facing arrangement state in the second housing member 22.

The first peripheral wall bodies 21b and 22b of the first housing member 21 and the second housing member 22 have first outlets $21b_1$ and $22b_1$ for drawing out one end side of the first electric wire WE1 to the outside and second outlets $21b_2$ and $22b_2$ for drawing out one end side of the second electric wire WE2 to the outside, respectively (FIG. 2 and FIG. 3). In the respective first peripheral wall bodies $21b$ and $22b$, the first outlets $21b_1$ and $22b_1$ are disposed to face each other, and the second outlets $21b_2$ and $22b_2$ are disposed to face each other.

The second peripheral wall bodies $21c$ and $22c$ of the first housing member 21 and the second housing member 22 have third outlets $21c_1$ and $22c_1$ for drawing out the other end side of the first electric wire WE1 to the outside and fourth outlets $21c_2$ and $22c_2$ for drawing out the other end side of the second electric wire WE2 to the outside, respectively (FIG. 2 and FIG. 3). In the respective second peripheral wall bodies $21c$ and $22c$, the third outlets $21c_1$ and $22c_1$ are disposed to face each other, and the fourth outlets $21c_2$ and $22c_2$ are disposed to face each other.

The housing 20 in this example has a holding body 23 for holding with respect to an installation object of the noise filter 1A (FIG. 3). The holding body 23 causes the installation object to hold the housing 20 by engaging with a counterpart holding body (not illustrated) of the installation object. Here, the holding body 23 is provided on an outer wall surface of the main wall body 21a of the first housing member 21.

Furthermore, the noise filter 1A includes a first electric connection structure 30 for electrically connecting the intermediate connection portion WE1a of the first electric wire WE1 to the first circuit connection member 12 of the filter circuit 10, and a second electric connection structure 40 for electrically connecting the intermediate connection portion WE2a of the second electric wire WE2 to the second circuit connection member 13 of the filter circuit 10 (FIG. 1 to FIG. 3). The first electric connection structure 30 and the second electric connection structure 40 are stored in the accommodation chamber 20a of the housing 20.

The first electric connection structure 30 performs mutual connection such that an axial direction of the first electric wire WE1 extends along a plane of the main body 12a of the first circuit connection member 12. In addition, the second electric connection structure 40 performs mutual connection such that an axial direction of the second electric wire WE2 extends along a plane of the main body 13a of the second circuit connection member 13. Further, the first electric connection structure 30 and the second electric connection structure 40 connect the first electric wire WE1 and the first circuit connection member 12 to each other and connect the second electric wire WE2 and the second circuit connection member 13 to each other such that the respective axial directions of the first electric wire WE1 and the second electric wire WE2 correspond to the same direction.

The first electric connection structure 30 includes a first electric wire side connection body 31 physically and electrically connected to the intermediate connection portion WE1a of the first electric wire WE1, and a first circuit side connection body 32 physically and electrically connected to the first electric wire side connection body 31 and the first circuit connection member 12 (FIG. 1 and FIG. 2).

The first electric wire side connection body 31 in this example is molded as one member (first electric wire side connection member) using a conductive material such as metal. For example, the first electric wire side connection body 31 is a tubular member physically and electrically connected to the intermediate connection portion WE1a by performing caulking while winding a rectangular metal plate around the intermediate connection portion WE1a of the first electric wire WE1. The first electric wire side connection body 31 in this example is molded into a tubular shape (FIG. 1 and FIG. 2).

The first circuit side connection body 32 is formed to be indirectly electrically connected to the intermediate connection portion WE1a of the first electric wire WE1. The first circuit side connection body 32 in this example is indirectly electrically connected to the intermediate connection portion WE1a by an elastic force indirectly applied to the intermediate connection portion WE1a of the first electric wire WE1. Specifically, an elastic force is directly exerted on the first electric wire side connection body 31, and the first circuit side connection body 32 is indirectly electrically connected to the intermediate connection portion WE1a of the first electric wire WE1 by the elastic force exerted on the first electric wire side connection body 31. The first circuit side connection body 32 is provided on the first circuit connection member 12. The first circuit side connection body 32 may be molded as one member or included in a certain member as a part.

The former first circuit side connection body 32 is molded as a different member from the first circuit connection member 12. The first circuit side connection body 32 is provided on the first circuit connection member 12 by being physically and electrically connected to the first circuit connection member 12 by welding, etc.

In addition, for example, the latter first circuit side connection body 32 is molded integrally with the main body 12a of the first circuit connection member 12, and is provided as a body included in the first circuit connection member 12. This first electric connection structure 30 in this example includes this latter first circuit side connection body 32 (FIG. 1 to FIG. 3). Here, the first circuit side connection body 12b of the first circuit connection member 12 is used as the first circuit side connection body 32 of the first electric connection structure 30.

Figure 4:
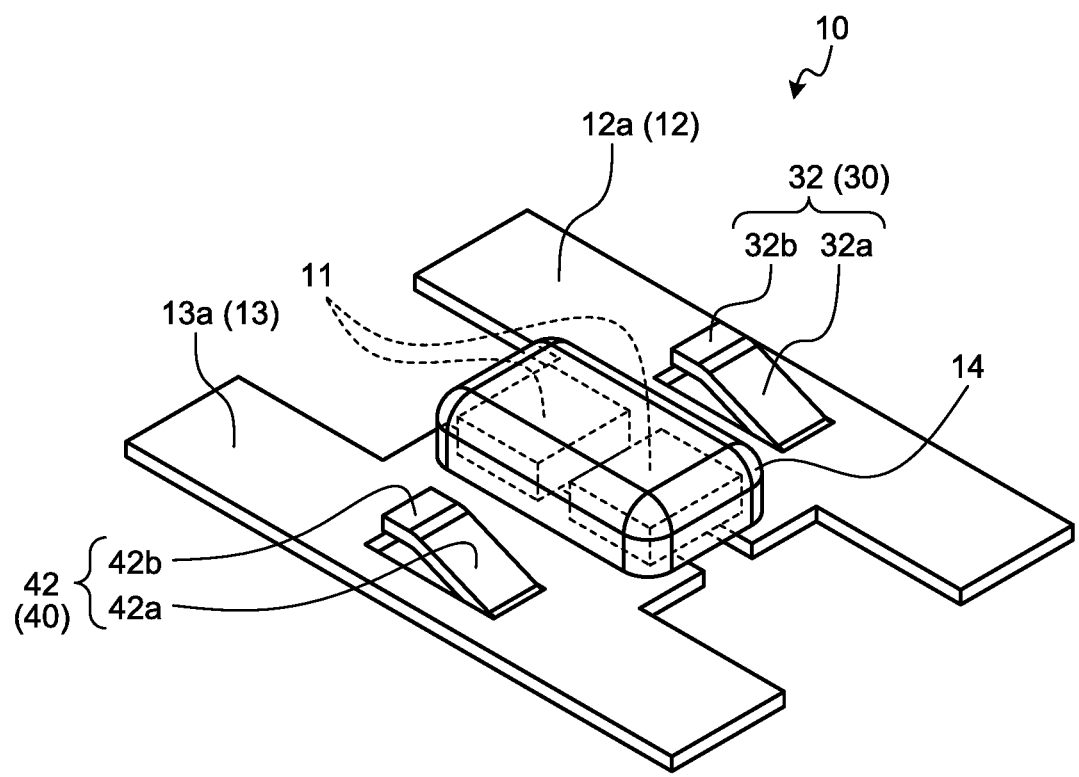
FIG. 4 is a perspective view illustrating a filter circuit of the noise filter of the embodiment.
Figure 5:
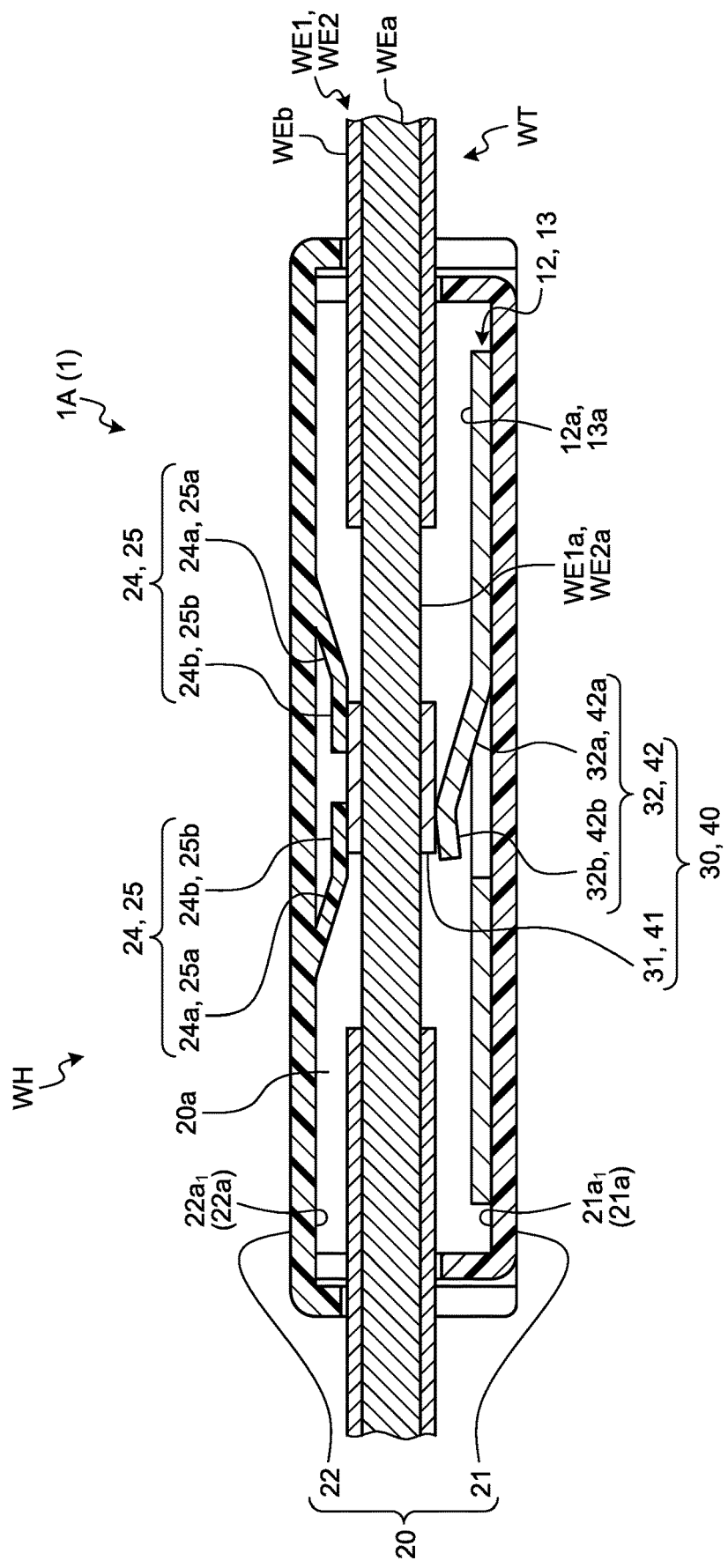
FIG. 5 is a cross-sectional view schematically illustrating a cross section taken along X1-X1 line and a cross section taken along X2-X2 line of FIG. 1.
Figure 6:
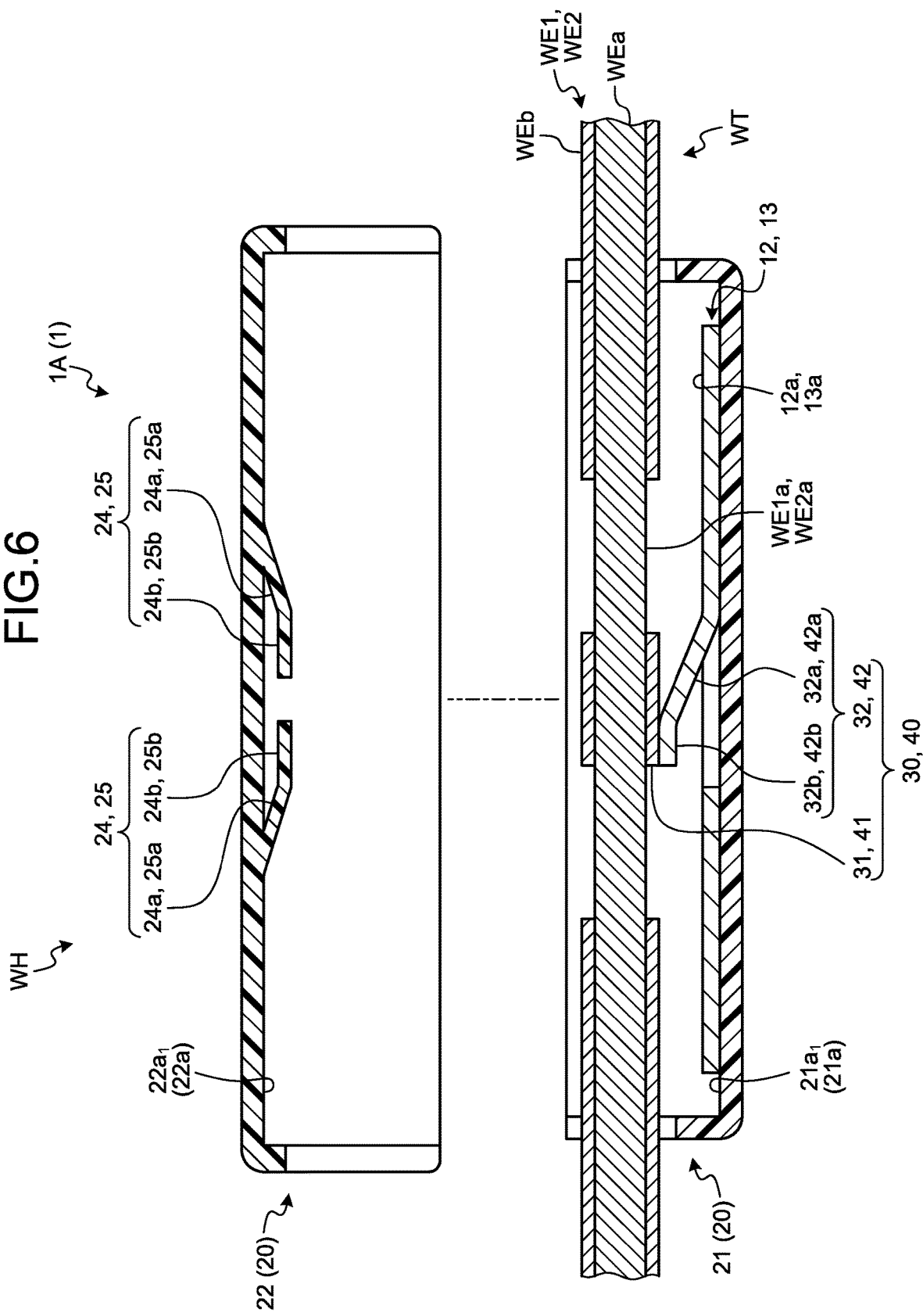
FIG. 6 is a cross-sectional view illustrating a part of an assembling process of the noise filter and the wire harness of the embodiment.

The first circuit side connection body 32 (12b) includes a piece (hereinafter referred to as an "elastic piece") 32a having elasticity and a single body shape of a cantilever whose free end side is raised from the main body 12a of the first circuit connection member 12, and a contact portion 32b provided at a free end of the elastic piece 32a and directly electrically connected to the first electric wire side connection body 31 (FIG. 4 to FIG. 6). The first circuit side connection body 32 is physically and electrically connected to the first electric wire side connection body 31 by generating an elastic force using the elastic piece 32a and causing the elastic force to directly act on the first electric wire side connection body 31 from the contact portion 32b. Therefore, the first circuit side connection body 32 can be indirectly electrically connected to the intermediate connection portion WE1a of the first electric wire WE1 via the first electric wire side connection body 31.

The second electric connection structure 40 includes a second electric wire side connection body 41 physically and electrically connected to the intermediate connection portion WE2a of the second electric wire WE2, and a second circuit side connection body 42 physically and electrically connected to the second electric wire side connection body 41 and the second circuit connection member 13 (FIG. 1 to FIG. 3).

The second electric wire side connection body 41 in this example is a tubular member having the same tubular shape as that of the first electric wire side connection body 31, and is physically and electrically connected to the intermediate connection portion WE2a by performing caulking while winding a rectangular metal plate around the intermediate connection portion WE2a of the second electric wire WE2 (FIG. 1 to FIG. 3).

The second circuit side connection body 42 is formed to be indirectly electrically connected to the intermediate connection portion WE2a of the second electric wire WE2. The second circuit side connection body 42 in this example is indirectly electrically connected to the intermediate connection portion WE2a by an elastic force indirectly applied to the intermediate connection portion WE2a of the second electric wire WE2. Specifically, an elastic force is directly exerted on the second electric wire side connection body 41, and the second circuit side connection body 42 is indirectly electrically connected to the intermediate connection portion WE2a of the second electric wire WE2 by the elastic force exerted on the second electric wire side connection body 41. The second circuit side connection body 42 is provided on the second circuit connection member 13. Similarly to the first circuit side connection body 32, the second circuit side connection body 42 may be molded as one member or included in a certain member as a part. The second circuit side connection body 42 in this example is molded integrally with the main body 13a of the second circuit connection member 13, and is provided as a body included in the second circuit connection member 13. Here, the second circuit side connection body 13b of the second circuit connection member 13 is used as the second circuit side connection body 42 of the second electric connection structure 40.

The second circuit side connection body 42 (13b) is formed in the same shape as that of the first circuit side connection body 32 (12b). Therefore, the second circuit side connection body 42 includes a piece (hereinafter referred to as an "elastic piece") 42a having elasticity and a single body shape of a cantilever whose free end side is raised from the main body 13a of the second circuit connection member 13, and a contact portion 42b provided at a free end of the elastic piece 42a and directly electrically connected to the second electric wire side connection body 41 (FIG. 4 to FIG. 6). The second circuit side connection body 42 is physically and electrically connected to the second electric wire side connection body 41 by generating an elastic force using the elastic piece 42a and causing the elastic force to directly act on the second electric wire side connection body 41 from the contact portion 42b. Therefore, the second circuit side connection body 42 can be indirectly electrically connected to the intermediate connection portion WE2a of the second electric wire WE2 via the second electric wire side connection body 41.

Here, the elastic force of the first circuit side connection body 32 is generated by clamping the first circuit connection member 12 and the first electric wire side connection body 31 between the inner wall surface $21a_1$ side of the main wall body 21a of the first housing member 21 and an inner wall surface $22a_1$ side of the main wall body 22a of the second housing member 22 when the first housing member 21 and the second housing member 22 are fit to each other (FIG. 5). Therefore, in the first electric connection structure 30, the first electric wire side connection body 31 and the first circuit side connection body 32 (the first circuit side connection body 12b of the first circuit connection member 12) are disposed to face each other in a fitting direction of the first housing member 21 and the second housing member 22.

In addition, the elastic force of the second circuit side connection body 42 is generated by clamping the second circuit connection member 13 and the second electric wire side connection body 41 between the inner wall surface $21a_1$ side of the main wall body 21a of the first housing member 21 and the inner wall surface $22a_1$ side of the main wall body 22a of the second housing member 22 when the first housing member 21 and the second housing member 22 are fit to each other (FIG. 5). Therefore, in the second electric connection structure 40, the second electric wire side connection body 41 and the second circuit side connection body 42 (the second circuit side connection body 13b of the second circuit connection member 13) are disposed to face each other in the fitting direction of the first housing member 21 and the second housing member 22.

In this noise filter 1A, to generate an elastic force in the first circuit side connection body 32 and the second circuit side connection body 42, the first electric wire side connection body 31 is clamped by the contact portion 32b of the first circuit side connection body 32 and the inner wall surface $22a_1$ side of the main wall body 22a of the second housing member 22, and the second electric wire side connection body 41 is clamped by the contact portion 42b of the second circuit side connection body 42 and the inner wall surface $22a_1$ side of the main wall body 22a of the second housing member 22 in the fitting direction of the first housing member 21 and the second housing member 22 (FIG. 5). That is, here, the fitting direction of the first housing member 21 and the second housing member 22 corresponds to a clamping direction (hereinafter referred to as an "electric wire clamping direction") with respect to the first electric wire side connection body 31 and the second electric wire side connection body 41.

At least one first clamping body 24 that indirectly clamps the intermediate connection portion WE1a of the first electric wire WE1 between the contact portion 32b of the first circuit side connection body 32 and the inner wall surface $22a_1$, and at least one second clamping body 25 that indirectly clamps the intermediate connection portion WE2a of the second electric wire WE2 between the contact portion 42b of the second circuit side connection body 42 and the inner wall surface $22a_1$ are provided on the inner wall surface $22a_1$ of the main wall body 22a of the second housing member 22 (FIG. 3, FIG. 5, and FIG. 6).

The first clamping body 24 indirectly clamps the intermediate connection portion WE1a of the first electric wire WE1 between the contact portion 32b and the first clamping body 24 by clamping the first electric wire side connection body 31 between the contact portion 32b of the first circuit side connection body 32 and the first clamping body 24. The first clamping body 24 includes a piece 24a having a single body shape of a cantilever whose free end side is raised from the inner wall surface $22a_1$ of the main wall body 22a of the second housing member 22 and a pressing portion 24b provided at a free end of the piece 24a to come into contact with and press the first electric wire side connection body 31 (FIG. 3, FIG. 5, and FIG. 6). The piece 24a may or may not have elasticity. In addition, the pressing portion 24b is disposed to face the contact portion 32b in the electric wire clamping direction. Here, the pressing portion 24b and the contact portion 32b are formed in rectangular single body shapes, respectively, and the first electric wire side connection body 31 is clamped between planes thereof.

The second clamping body 25 indirectly clamps the intermediate connection portion WE2a of the second electric wire WE2 between the contact portion 42b and the second clamping body 25 by clamping the second electric wire side connection body 41 between the contact portion 42b of the second circuit side connection body 42 and the second clamping body 25. The second clamping body 25 includes a piece 25a having a single body shape of a cantilever whose free end side is raised from the inner wall surface $22a_1$ of the main wall body 22a of the second housing member 22 and a pressing portion 25b provided at a free end of the piece 25a to come into contact with and press the second electric wire side connection body 41 (FIG. 3, FIG. 5, and FIG. 6). The piece 25a may or may not have elasticity. In addition, the pressing portion 25b is disposed to face the contact portion 42b in the electric wire clamping direction. Here, the pressing portion 25b and the contact portion 42b are formed in rectangular single body shapes, respectively, and the second electric wire side connection body 41 is clamped between planes thereof.

In the noise filter 1A, in an inner space of the first housing member 21, the first electric wire WE1 is disposed in a state in which the first electric wire side connection body 31 is placed on the contact portion 32b, and the second electric wire WE2 is disposed in a state in which the second electric wire side connection body 41 is placed on the contact portion 42b (FIG. 6). In the noise filter 1A, the second housing member 22 is fit to the first housing member 21 (FIG. 6).

When the first housing member 21 and the second housing member 22 are fit to each other, a pressing force from the pressing portion 24b to the contact portion 32b acts on the first electric wire side connection body 31, the first electric wire side connection body 31 pushes and moves the contact portion 32b, and thus an elastic force of the elastic piece 32a against a pushing force acts on the first electric wire side connection body 31 from the contact portion 32b. In addition, when the first housing member 21 and the second housing member 22 are fit to each other, a pressing force from the pressing portion 25b to the contact portion 42b acts on the second electric wire side connection body 41, the second electric wire side connection body 41 pushes and moves the contact portion 42b, and thus an elastic force of the elastic piece 42a against a pushing force acts on the second electric wire side connection body 41 from the contact portion 42b. Therefore, in the noise filter 1A, when the first housing member 21 and the second housing member 22 are fit to each other, the first electric wire side connection body 31 is clamped by the pressing portion 24b and the contact portion 32b so that the first electric wire side connection body 31 and the contact portion 32b are physically and electrically connected to each other, and the second electric wire side connection body 41 is clamped by the pressing portion 25b and the contact portion 42b so that the second electric wire side connection body 41 and the contact portion 42b are physically and electrically connected to each other. Therefore, in the noise filter 1A, the intermediate connection portion WE1a of the first electric wire WE1 and the first circuit connection member 12 of the filter circuit 10 are indirectly electrically connected via the first electric wire side connection body 31, and the intermediate connection portion WE2a of the second electric wire WE2 and the second circuit connection member 13 of the filter circuit 10 are indirectly electrically connected via the second electric wire side connection body 41.

Incidentally, as in Japanese Patent Application Laid-open No. 2012-039201 described above, in the conventional noise filter, an intermediate electric wire is interposed between the noise reduction target electric wire and the filter circuit. The intermediate electric wire has a large allowable tolerance regarding a length in consideration of assembling workability with respect to the noise filter, a wiring route to a vehicle, etc. For this reason, the conventional noise filter needs to adjust a filter circuit characteristic (resonance point, noise reduction performance, etc.) taking the noise component of the intermediate electric wire according to the length thereof into consideration. However, in the noise filter 1A, the filter circuit 10 is interposed between the intermediate connection portion WE1a of the first electric wire WE1 and the intermediate connection portion WE2a of the second electric wire WE2 bundled in the trunk line WT of the wire harness WH, and the filter circuit 10 is electrically connected to the respective intermediate connection portions WE1a and WE2a. Therefore, this noise filter 1A may not adjust a filter circuit characteristic taking an influence of a branched electric wire (intermediate electric wire) from the trunk line into consideration unlike the past. That is, the noise filter 1A is not affected by the intermediate electric wire.

Figure 7:
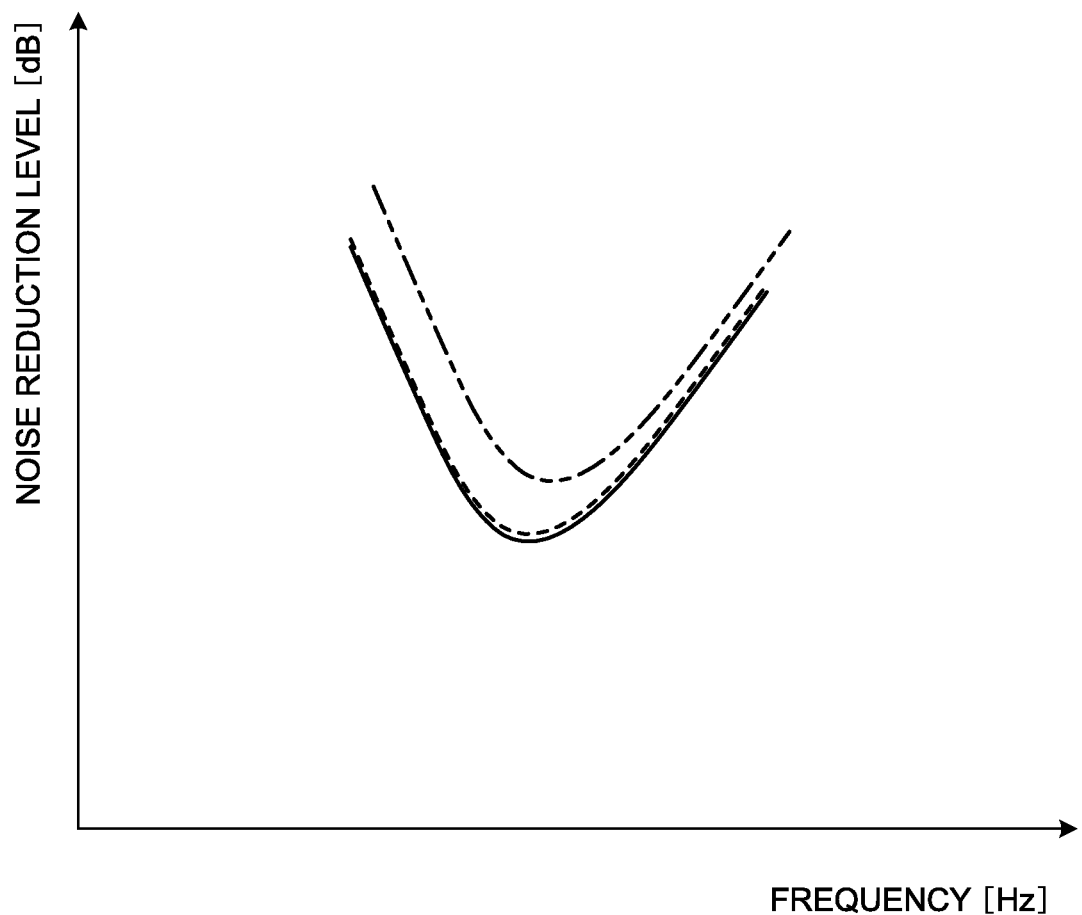
FIG. 7 is a conceptual diagram of a filter circuit characteristic of the noise filter of the embodiment.

FIG. 7 illustrates a conceptual diagram of a filter circuit characteristic in which a horizontal axis depicts a frequency and a vertical axis depicts a noise reduction level. In this figure, a required performance of noise reduction is indicated by a broken line, the filter circuit characteristic of the noise filter 1A of the present embodiment is indicated by a solid line, and the filter circuit characteristic of the conventional noise filter is indicated by an alternate long and two short dashes line.

For example, the noise filter 1A may be wrapped in an adhesive tape, etc. together with the trunk line WT, and held by the trunk line WT.

Furthermore, since the noise filter 1A electrically connects the filter circuit 10 to the intermediate connection portion WE2a of the second electric wire WE2 whose one end is grounded, for example, even when a conductor that can be grounded is not present around the trunk line WT, and even when an installation object is molded using an insulating material such as a synthetic resin, it is possible to easily perform grounding. That is, when the conventional noise filter is attached to a conductive installation object, the conventional noise filter is grounded through the installation object by connecting a ground terminal to the installation object. Therefore, in the conventional noise filter, the ground terminal is projected from the housing to facilitate a fixing operation of the ground terminal and the installation object. However, this noise filter 1A can be grounded without such a ground terminal. Therefore, the noise filter 1A can achieve reduction in size and weight of a frame.

Furthermore, in the noise filter 1A, an electric connection structure between the intermediate connection portion WE1a of the first electric wire WE1 and the first circuit side connection body 32 and an electric connection structure between the intermediate connection portion WE2a of the second electric wire WE2 and the second circuit side connection body 42 utilize an elastic force of each of the first circuit side connection body 32 and the second circuit side connection body 42. Therefore, when compared to a case in which a connection structure corresponds to a fitting structure of male and female terminal portions as in the past, the noise filter 1A can achieve reduction in size of each connection structure. Therefore, the noise filter 1A can achieve reduction in size of the frame. In addition, even though such a conventional connection structure may cause a steep rise in cost depending on the shape, since the noise filter 1A corresponds to a connection structure utilizing an elastic force, it is possible to simplify the structure and suppress the steep rise in cost.

Furthermore, this noise filter 1A can absorb a dimensional variation of each component and exert a stable contact load on the respective intermediate connection portions WE1a and WE2a by adopting such a connection structure based on the elastic force. In addition, even when the dimensional variation of each component further increases, the noise filter 1A can absorb the dimensional variation and apply a stable contact load to each intermediate connection portion WE2a by assigning elasticity to the piece 24a of the first clamping body 24 and the piece 25a of the second clamping body 25 in cooperation with elasticity of the first circuit side connection body 32 and the second circuit side connection body 42. Due to such a characteristic, the noise filter 1A can improve a quality of conduction between the first electric wire WE1 and the second electric wire WE2, and the filter circuit 10.

Furthermore, by adopting a connection structure based on an elastic force, the noise filter 1A can attempt electric connection to electric wires having various outer diameters (the first electric wire WE1 and the second electric wire WE2) within a range of an elastic region of the first circuit side connection body 32 and the second circuit side connection body 42. In addition, when elasticity is assigned to the piece 24a of the first clamping body 24 and the piece 25a of the second clamping body 25, the noise filter 1A can attempt electric connection to electric wires having various outer diameters (the first electric wire WE1 and the second electric wire WE2) within a range of an elastic region including the elasticities thereof. That is, the noise filter 1A can cope with electric wires having various outer diameters (the first electric wire WE1 and the second electric wire WE2), and versatility can be enhanced.

Noise Filter 1B

Here, the noise filter 1 of the present embodiment may be configured as a noise filter 1B in which a first clamping body 124 and a second clamping body 125 described below are provided in a second housing member 122 in place of the second housing member 22 having the first clamping body 24 and the second clamping body 25 described above (FIG. 8 and FIG. 9). This noise filter 1B can obtain a similar effect to that of the above-mentioned noise filter 1A, and can obtain an effect described below by the first clamping body 124 and the second clamping body 125.

The second housing member 122 is a housing member in which the first clamping body 24 is replaced with the first clamping body 124 and the second clamping body 25 is replaced with the second clamping body 125 in the second housing member 22 described above. The second housing member 122 is included in a housing 120 in which an accommodation chamber 120a is formed inward by being fit to the first housing member 21 described above (FIG. 9). Two first clamping bodies 124 and two second clamping bodies 125 are provided on an inner wall surface $122a_1$ of a main wall body 122a of the second housing member 122 (FIG. 8 and FIG. 9).

Figure 9:
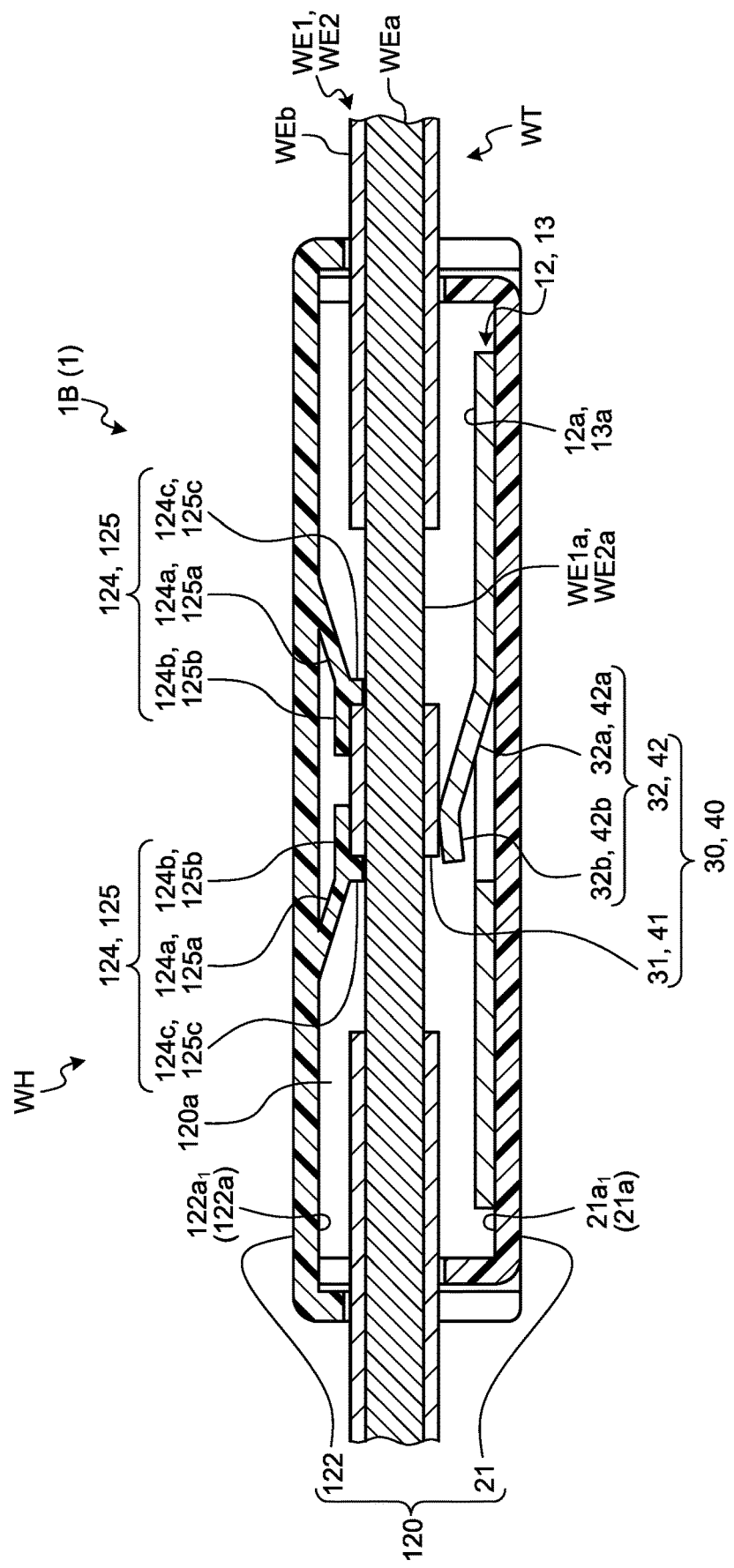
FIG. 9 is a perspective view illustrating the first modification of the noise filter and the wire harness of the embodiment.
Figure 10:
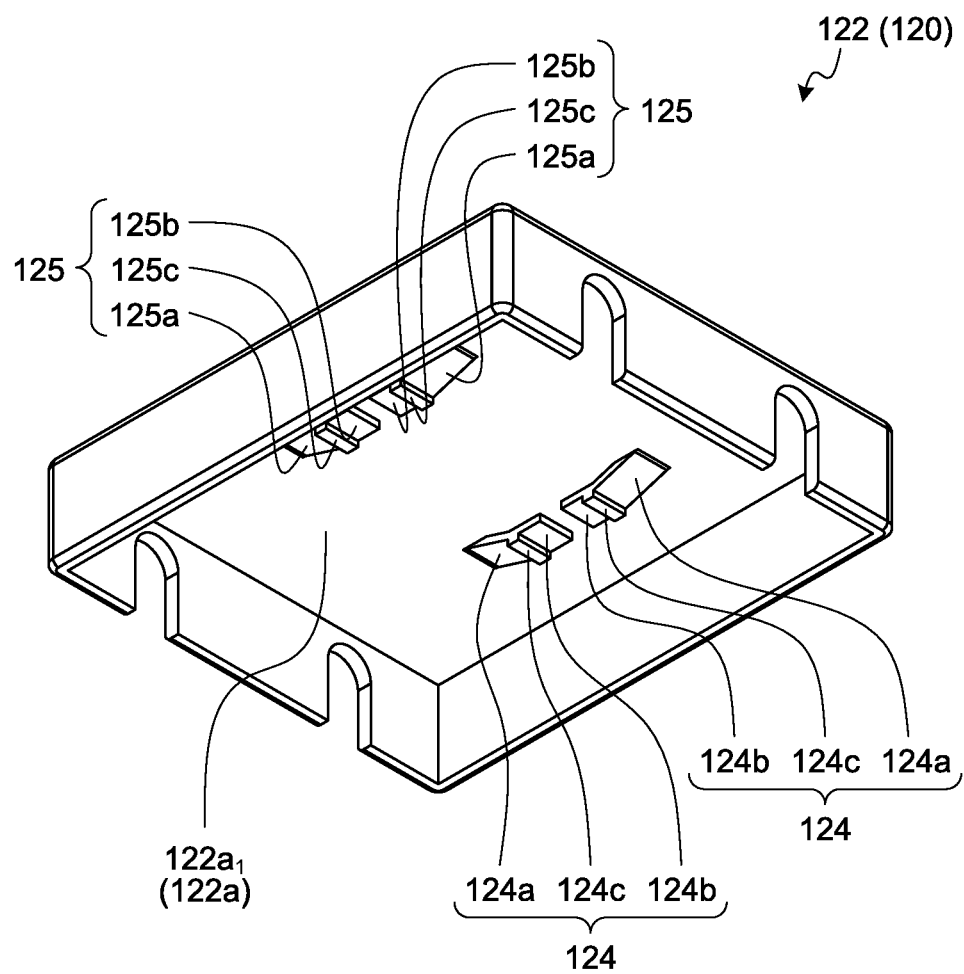
FIG. 10 is a perspective view illustrating a second housing member of the first modification.

In addition to a piece 124a and a pressing portion 124b similar to those of the first clamping body 24 described above, the first clamping body 124 has a locking projection 124c bulged out from the pressing portion 124b (FIG. 8 to FIG. 10). In addition, in addition to a piece 125a and a pressing portion 125b similar to those of the second clamping body 25 described above, the second clamping body 125 has a locking projection 125c bulged out from the pressing portion 125b (FIG. 8 to FIG. 10).

In the noise filter 1B, the first electric wire side connection body 31 is clamped by the pressing portion 124b and the contact portion 32b of each of the two first clamping bodies 124, and the second electric wire side connection body 41 is clamped by the pressing portion 125b and the contact portion 42b of each of the two second clamping bodies 125 (FIG. 8 and FIG. 9). In this instance, the contact portion 32b may be disposed to face only the pressing portion 124b of one of the first clamping bodies 124 in the electric wire clamping direction or disposed to face the respective pressing portions 124b of both the first clamping bodies 124 in the electric wire clamping direction. Similarly thereto, the contact portion 42b may be disposed to face only the pressing portion 125b of one of the second clamping bodies 125 in the electric wire clamping direction or disposed to face the respective pressing portions 125b of both the second clamping bodies 125 in the electric wire clamping direction.

In addition, the locking projection 124c of one of the first clamping bodies 124 is formed to lock one end of the first electric wire side connection body 31 in a tube axis direction in the tube axis direction (FIG. 9). Further, the locking projection 124c of the other one of the first clamping bodies 124 is formed to lock the other end of the first electric wire side connection body 31 in the tube axis direction in the tube axis direction (FIG. 9). That is, in the noise filter 1B, the first electric wire side connection body 31 is clamped from both ends in the tube axis direction using two locking projections 124c. Further, the locking projection 125c of one of the second clamping bodies 125 is formed to lock one end of the second electric wire side connection body 41 in the tube axis direction in the tube axis direction (FIG. 9). Further, the locking projection 125c of the other one of the second clamping bodies 125 is formed to lock the other end of the second electric wire side connection body 41 in the tube axis direction in the tube axis direction (FIG. 9). That is, in the noise filter 1B, the second electric wire side connection body 41 is clamped from both ends in the tube axis direction using two locking projections 125c. In this way, in the noise filter 1B, the first electric wire side connection body 31, the first electric wire WE1, the second electric wire side connection body 41, and the second electric wire WE2 in the accommodation chamber 120a of the housing 120 can be positioned by the two locking projections 124c and the two locking projections 125c. Therefore, the noise filter 1B can further improve the quality of conduction between the first electric wire WE1 and the second electric wire WE2, and the filter circuit 10.

Noise Filter 1C

In addition, the noise filter 1 of the present embodiment may be configured as a noise filter 1C in which a first clamping body 224 and a second clamping body 225 described below are provided in a second housing member 222 in place of the second housing member 22 having the first clamping body 24 and the second clamping body 25 described above (FIG. 11 and FIG. 12). This noise filter 1C can obtain a similar effect to that of the above-mentioned noise filter 1A, and can obtain an effect described below by the first clamping body 224 and the second clamping body 225.

The second housing member 222 is a housing member in which the first clamping body 24 is replaced with the first clamping body 224 and the second clamping body 25 is replaced with the second clamping body 225 in the second housing member 22 described above. The second housing member 222 is included in a housing 220 in which an accommodation chamber 220a is formed inward by being fit to the first housing member 21 described above (FIG. 12). Two first clamping bodies 224 and two second clamping bodies 225 are provided on an inner wall surface $222a_1$ of a main wall body 222a of the second housing member 222 (FIG. 11 and FIG. 12).

Figure 12:
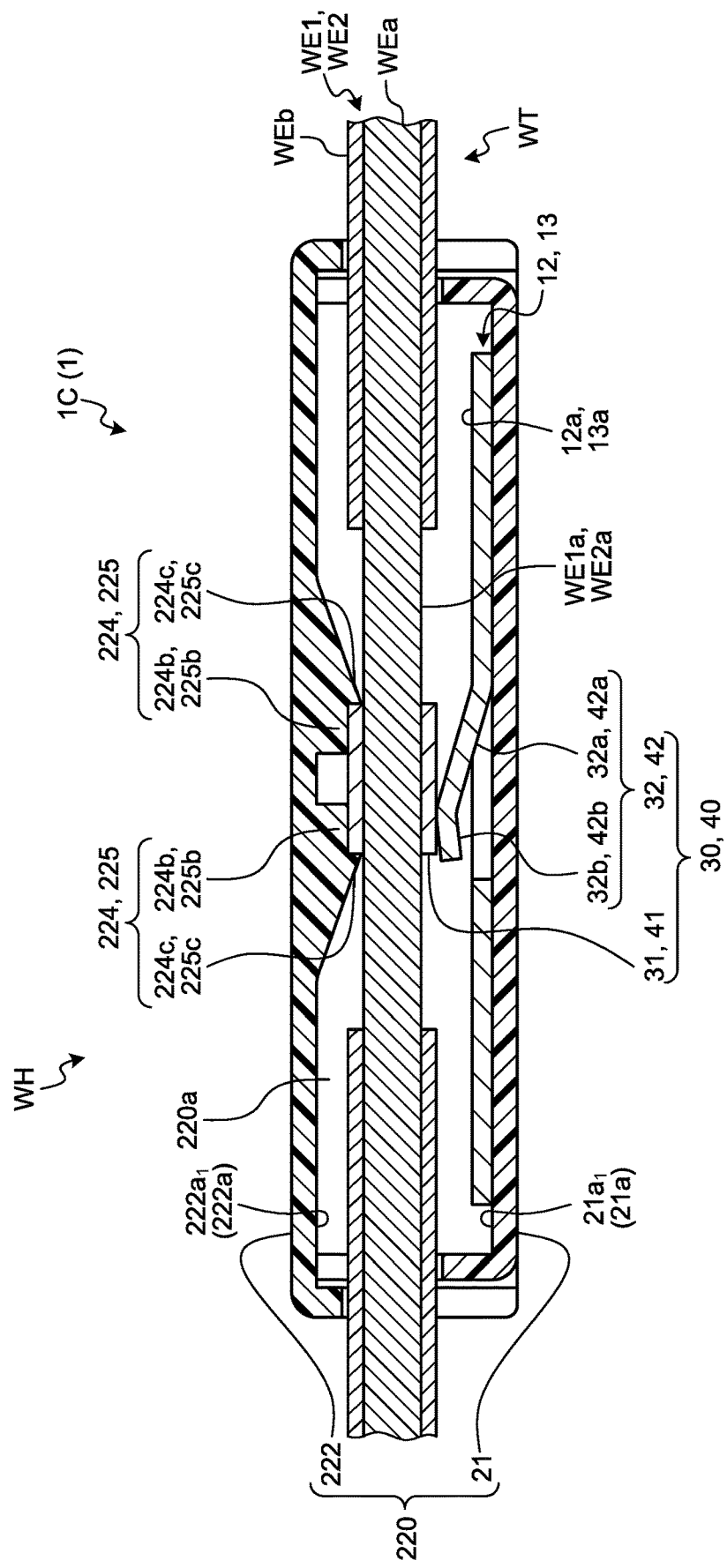
FIG. 12 is a perspective view illustrating the second modification of the noise filter and the wire harness of the embodiment.

The first clamping body 224 has a pressing portion 224b bulged out from the inner wall surface $222a_1$ of the main wall body 222a to come into contact with and press the first electric wire side connection body 31, and a locking projection 224c bulged out from the inner wall surface $222a_1$ (FIG. 11 and FIG. 12). In addition, the second clamping body 225 has a pressing portion 225b bulged out from the inner wall surface 222a₁ of the main wall body 222a to come into contact with and press the second electric wire side connection body 41, and a locking projection 225c bulged out from the inner wall surface 222a₁ (FIG. 11 and FIG. 12).

In the noise filter 1C, the first electric wire side connection body 31 is clamped by the pressing portion 224b and the contact portion 32b of each of the two first clamping bodies 224, and the second electric wire side connection body 41 is clamped by the pressing portion 225b and the contact portion 42b of each of the two second clamping bodies 225. In this instance, the contact portion 32b may be disposed to face only the pressing portion 224b of one of the first clamping bodies 224 in the electric wire clamping direction or disposed to face the respective pressing portions 224b of both the first clamping bodies 224 in the electric wire clamping direction. Similarly thereto, the contact portion 42b may be disposed to face only the pressing portion 225b of one of the second clamping bodies 225 in the electric wire clamping direction or disposed to face the respective pressing portions 225b of both the second clamping bodies 225 in the electric wire clamping direction.

In addition, the locking projection 224c of one of the first clamping bodies 224 is formed to lock one end of the first electric wire side connection body 31 in the tube axis direction in the tube axis direction (FIG. 12). Further, the locking projection 224c of the other one of the first clamping bodies 224 is formed to lock the other end of the first electric wire side connection body 31 in the tube axis direction in the tube axis direction (FIG. 12). That is, in the noise filter 1C, the first electric wire side connection body 31 is clamped from both ends in the tube axis direction using two locking projections 224c. Further, the locking projection 225c of one of the second clamping bodies 225 is formed to lock one end of the second electric wire side connection body 41 in the tube axis direction in the tube axis direction (FIG. 12). Further, the locking projection 225c of the other one of the second clamping bodies 225 is formed to lock the other end of the second electric wire side connection body 41 in the tube axis direction in the tube axis direction (FIG. 12). That is, in the noise filter 1C, the second electric wire side connection body 41 is clamped from both ends in the tube axis direction using two locking projections 225c. In this way, in the noise filter 1C, the first electric wire side connection body 31, the first electric wire WE1, the second electric wire side connection body 41, and the second electric wire WE2 in the accommodation chamber 220a of the housing 220 can be positioned by the two locking projections 224c and the two locking projections 225c. Therefore, the noise filter 1C can further improve the quality of conduction between the first electric wire WE1 and the second electric wire WE2, and the filter circuit 10.

Noise Filter 1D

The noise filter 1 of the present embodiment may be configured as a noise filter 1D in which a first electric connection structure 330 including a first circuit side connection body 332 and a second electric connection structure 340 including a second circuit side connection body 342 described below is provided in place of the first electric connection structure 30 including the first circuit side connection body 32 (12b) and the second electric connection structure 40 including the second circuit side connection body 42 (13b) described above (FIG. 13 and FIG. 14). This noise filter 1D can obtain a similar effect to that of the above-mentioned noise filter 1A, and can obtain an effect described below by the first circuit side connection body 332 and the second circuit side connection body 342.

Figure 13:
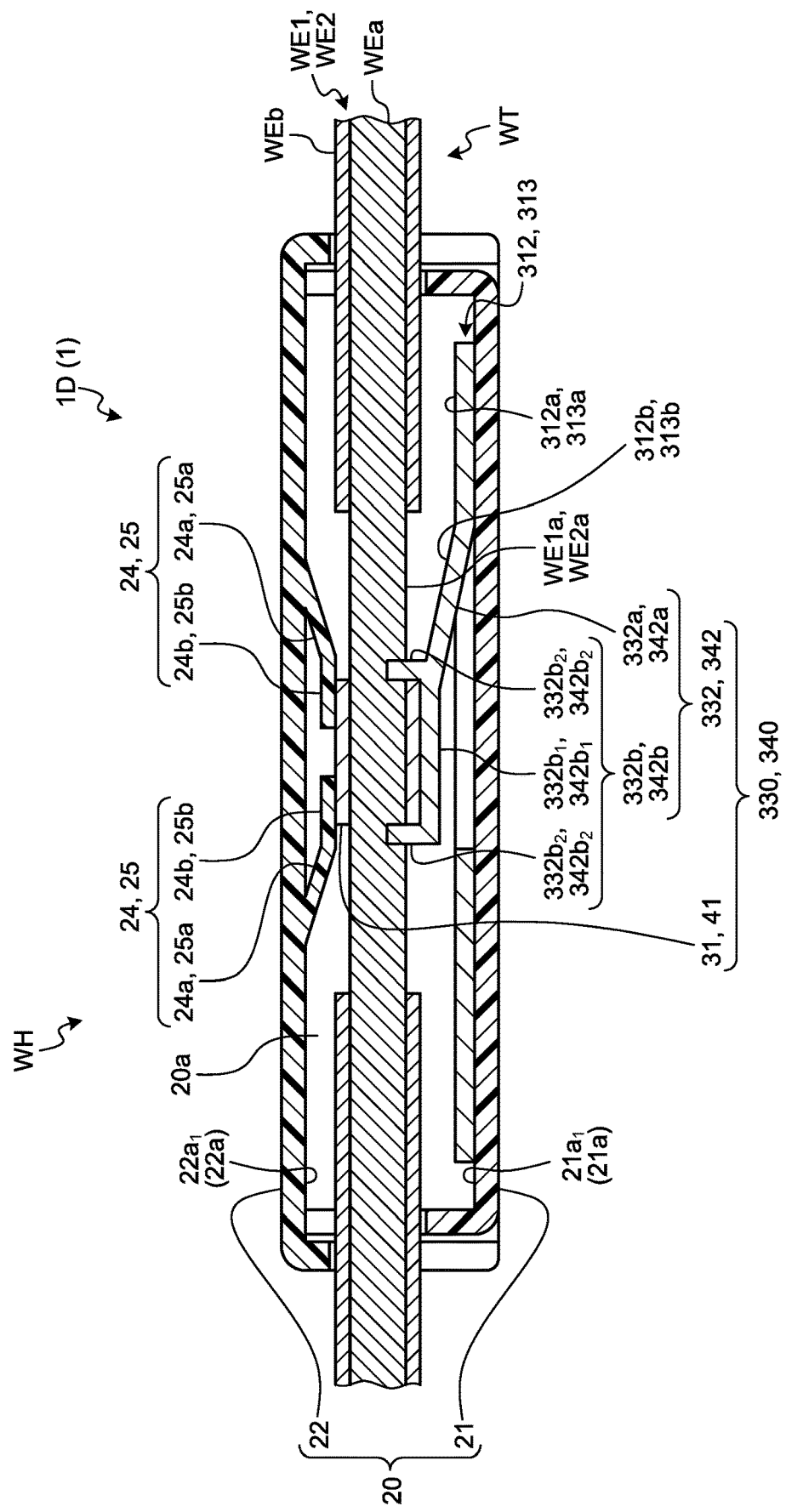
FIG. 13 is a perspective view illustrating a third modification of the noise filter and the wire harness of the embodiment.
Figure 15:
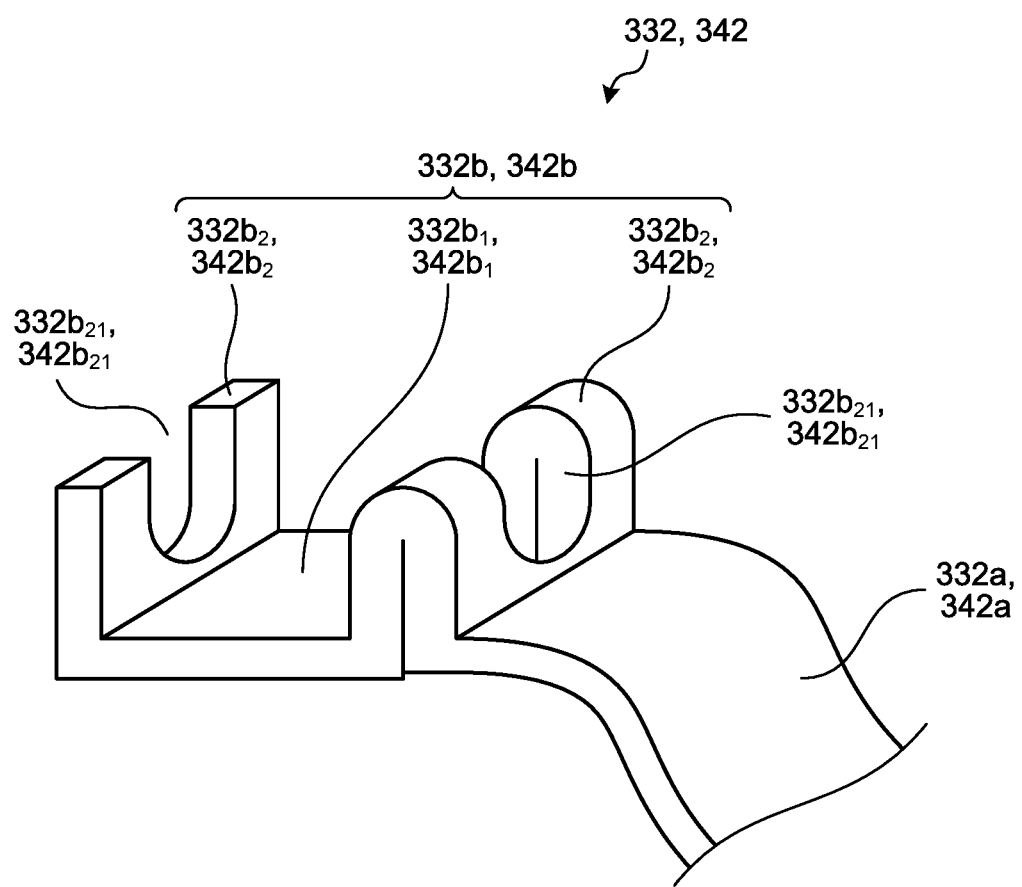
FIG. 15 is a perspective view illustrating first and second circuit connection bodies of the fourth modification.

As in the previous example, the first circuit side connection body 332 is provided on a first circuit connection member 312 including a main body 312a and a first circuit side connection body 312b, and uses the first circuit side connection body 312b (FIG. 13 and FIG. 14). The first circuit side connection body 332 has an elastic piece 332a similar to the first circuit side connection body 32 (12b) described above and has a contact portion 332b provided at a free end of the elastic piece 332a and directly electrically connected to the first electric wire side connection body 31 (FIG. 13 to FIG. 15). The contact portion 332b in this example has a rectangular piece 332b₁ similar to the contact portion 32b in contact with an outer peripheral surface of the first electric wire side connection body 31, and two locking projections 332b₂ projected from the piece 332b₁ to interpose both ends of the first electric wire side connection body 31 in the tube axis direction in the tube axis direction (FIG. 13 to FIG. 15). An arc-shaped notch 332b₂₁ into which the intermediate connection portion WE1a of the first electric wire WE1 is inserted is provided in each of the locking projections 332b₂ in this example (FIG. 15). The first circuit side connection body 332 forms the first electric connection structure 330 as a pair with the first electric wire side connection body 31 described above.

Similarly to the previous example, the second circuit side connection body 342 is provided on a second circuit connection member 313 having a main body 313a and a second circuit side connection body 313b, and uses the second circuit side connection body 313b (FIG. 13 and FIG. 14). The second circuit side connection body 342 has an elastic piece 342a similar to the second circuit side connection body 42 (13b) described above and has a contact portion 342b provided at a free end of the elastic piece 342a and directly electrically connected to the second electric wire side connection body 41 (FIG. 13 to FIG. 15). The contact portion 342b in this example has a rectangular piece 342b₁ similar to the contact portion 42b in contact with an outer peripheral surface of the second electric wire side connection body 41, and two locking projections 342b₂ projected from the piece 342b₁ to interpose both ends of the second electric wire side connection body 41 in the tube axis direction in the tube axis direction (FIG. 13 to FIG. 15). An arc-shaped notch 342b₂₁ into which the intermediate connection portion WE2a of the second electric wire WE2 is inserted is provided in each of the locking projections 342b₂ in this example (FIG. 15). The second circuit side connection body 342 forms the second electric connection structure 340 as a pair with the second electric wire side connection body 41 described above.

The noise filter 1D can position the first electric wire side connection body 31, the first electric wire WE1, the second electric wire side connection body 41, and the second electric wire WE2 in the accommodation chamber 20a of the housing 20 by the two locking projections 332b₂ and the two locking projections 342b₂. Therefore, the noise filter 1D can further improve the quality of conduction between the first electric wire WE1 and the second electric wire WE2, and the filter circuit 10.

Noise Filter 1E

The noise filter 1 of the present embodiment may be configured as a noise filter 1E in which a first electric connection structure 430 and a second electric connection structure 440 described below are provided in place of the first electric connection structure 30 and the second electric connection structure 40 described above (FIG. 16). This noise filter 1E can obtain a similar effect to that of the above-mentioned noise filter 1A, and can obtain an effect described below by the first electric connection structure 430 and the second electric connection structure 440.

The first electric connection structure 430 includes the first circuit side connection body 32 without having the first electric wire side connection body 31. The first electric connection structure 430 clamps the intermediate connection portion WE1*a* of the first electric wire WE1 by the pressing portion 24*b* and the contact portion 32*b* of the first circuit side connection body 32 in cooperation with the first clamping body 24 of the second housing member 22.

That is, the first circuit side connection body 32 in this example is formed to be directly electrically connected to the intermediate connection portion WE1*a* of the first electric wire WE1. The first circuit side connection body 32 is directly electrically connected to the intermediate connection portion WE1*a* of the first electric wire WE1 by an elastic force directly applied to the intermediate connection portion WE1*a*. Further, the first clamping body 24 in this example is formed to directly clamp the intermediate connection portion WE1*a* of the first electric wire WE1 between the first clamping body 24 and the contact portion 32*b* of the first circuit side connection body 32.

In addition, the second electric connection structure 440 includes the second circuit side connection body 42 without the second electric wire side connection body 41. The second electric connection structure 440 clamps the intermediate connection portion WE2*a* of the second electric wire WE2 by the pressing portion 25*b* and the contact portion 42*b* of the second circuit side connection body 42 in cooperation with the second clamping body 25 of the second housing member 22.

That is, the second circuit side connection body 42 in this example is formed to be directly electrically connected to the intermediate connection portion WE2*a* of the second electric wire WE2. The second circuit side connection body 42 is directly electrically connected to the intermediate connection portion WE2*a* of the second electric wire WE2 by an elastic force directly applied to the intermediate connection portion WE2*a*. Further, the second clamping body 25 in this example is formed to directly clamp the intermediate connection portion WE2*a* of the second electric wire WE2 between the second clamping body 25 and the contact portion 42*b* of the second circuit side connection body 42.

Figure 16:
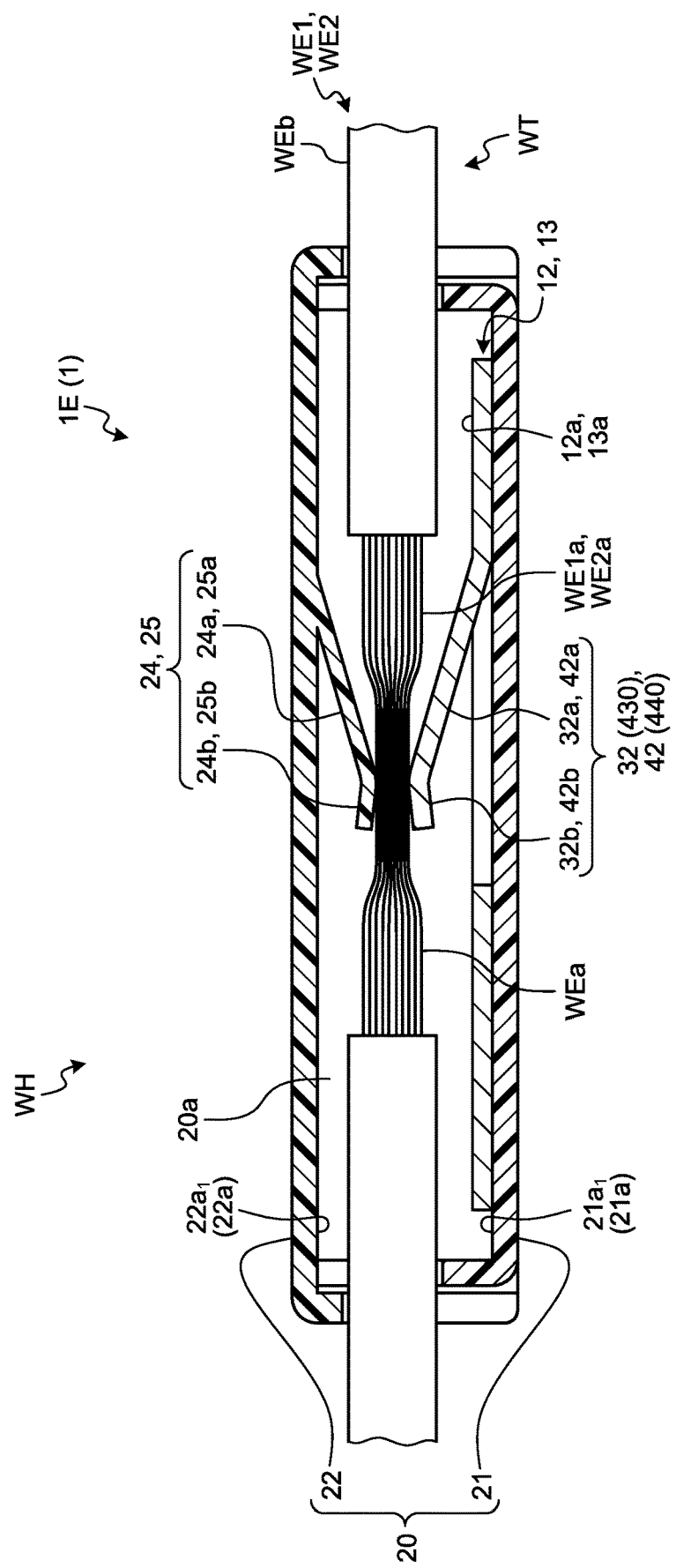
FIG. 16 is a perspective view illustrating a fifth modification of the noise filter and the wire harness of the embodiment.

Here, it is desirable to use the noise filter 1E in a case of applying the first electric wire WE1 and the second electric wire WE2 whose core wire WEa is a single wire such as a round conductor. A reason therefor is that in a case in which the core wire WEa is an aggregate obtained by bundling a plurality of strands in each of the intermediate connection portions WE1*a* and WE2*a*, the respective strands may be separated at the time of being clamped by the pressing portions 24*b* and 25*b* and the contact portions 32*b* and 42*b*, and thus it may not be possible to receive a pushing force from the pressing portions 24*b* and 25*b* and an elastic force from the contact portions 32*b* and 42*b*. That is, a reason therefor is that in a case in which the core wire WEa is an aggregate of a plurality of strands, an appropriate contact load may not be applied to each of the intermediate connection portions WE1*a* and WE2*a*, and there is a possibility that conduction between each of the intermediate connection portions WE1*a* and WE2*a* and the filter circuit 10 may not be smoothly performed. However, even when the core wire WEa is an aggregate of a plurality of strands, the first electric wire WE1 and the second electric wire WE2 can be applied to the noise filter 1E without including the first electric wire side connection body 31 or the second electric wire side connection body 41 by welding the plurality of strands in the intermediate connection portions WE1*a* and WE2*a* using thermo-compression bonding, etc. and fixing the plurality of strands collectively (FIG. 16).

In this way, since the number of parts is reduced in the first electric connection structure 430 and the second electric connection structure 440, the noise filter 1E can attempt weight reduction, improvement in assembling workability, and cost reduction.

Noise Filter 1F

The noise filter 1 of the present embodiment may be configured as a noise filter 1F in which a second housing member 522 having a first clamping body 524 and a second clamping body 525, a first electric connection structure 530, and a second electric connection structure 540 described below are provided in place of the second housing member 22 having the first clamping body 24 and the second clamping body 25, the first electric connection structure 30, and the second electric connection structure 40 described above (FIG. 17 and FIG. 18). This noise filter 1F can obtain a similar effect to that of the above-mentioned noise filter 1A, and can obtain an effect described below by the first clamping body 524, the second clamping body 525, the first electric connection structure 430, and the second electric connection structure 440.

Figure 18:
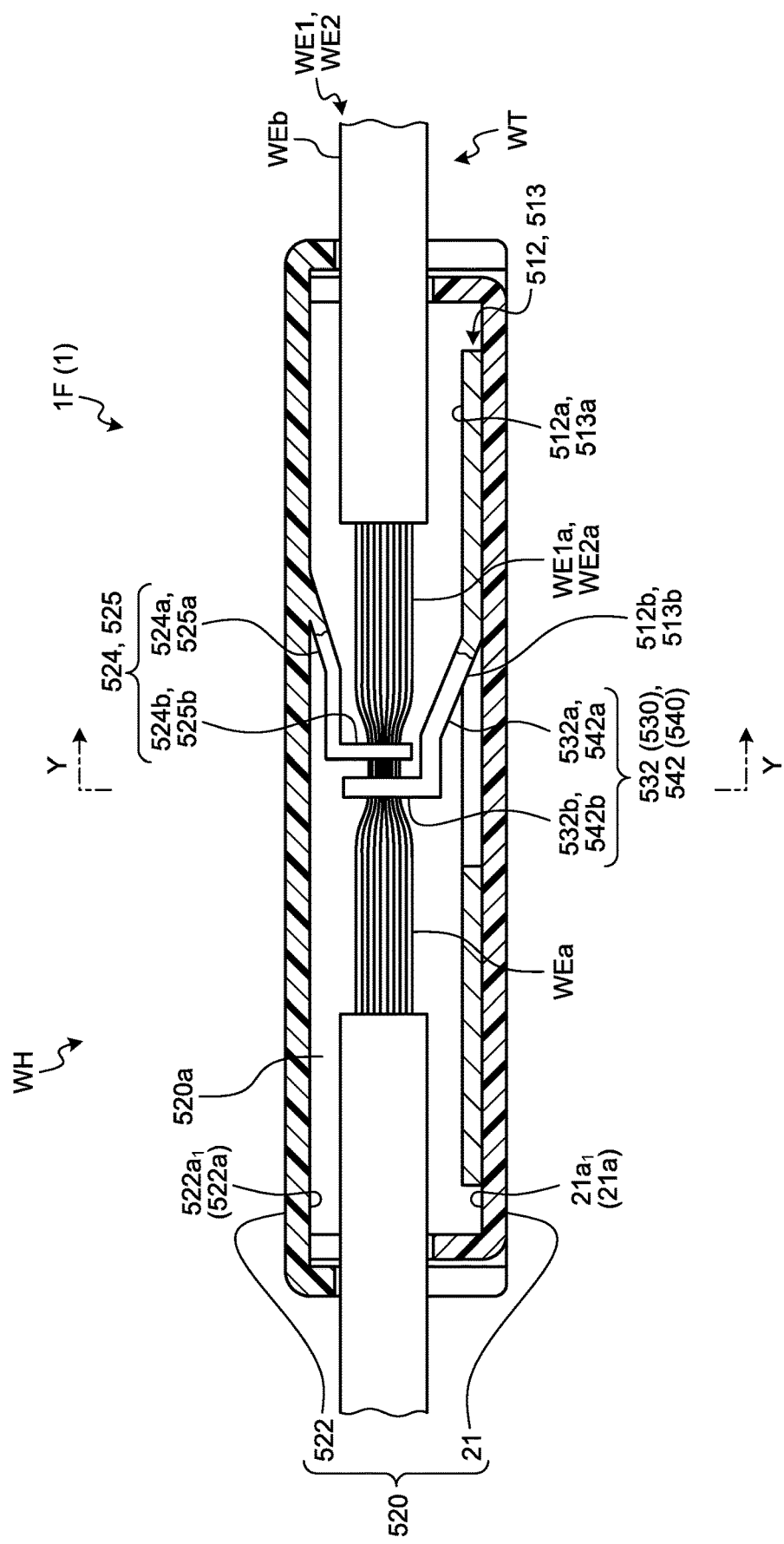
FIG. 18 is a perspective view illustrating the sixth modification of the noise filter and the wire harness of the embodiment.

The second housing member 522 is obtained by replacing the first clamping body 24 with the first clamping body 524 and replacing the second clamping body 25 with the second clamping body 525 in the second housing member 22 described above. The second housing member 522 is included in a housing 520 having an accommodation chamber 520*a* formed inward by being fit to the first housing member 21 described above (FIG. 18). At least one first clamping body 524 and at least one second clamping body 525 are provided on an inner wall surface 522*a*$_1$ of a main wall body 522*a* of the second housing member 522 (FIG. 17 and FIG. 18). Here, one first clamping body 524 and one second clamping body 525 are provided.

Figure 19:
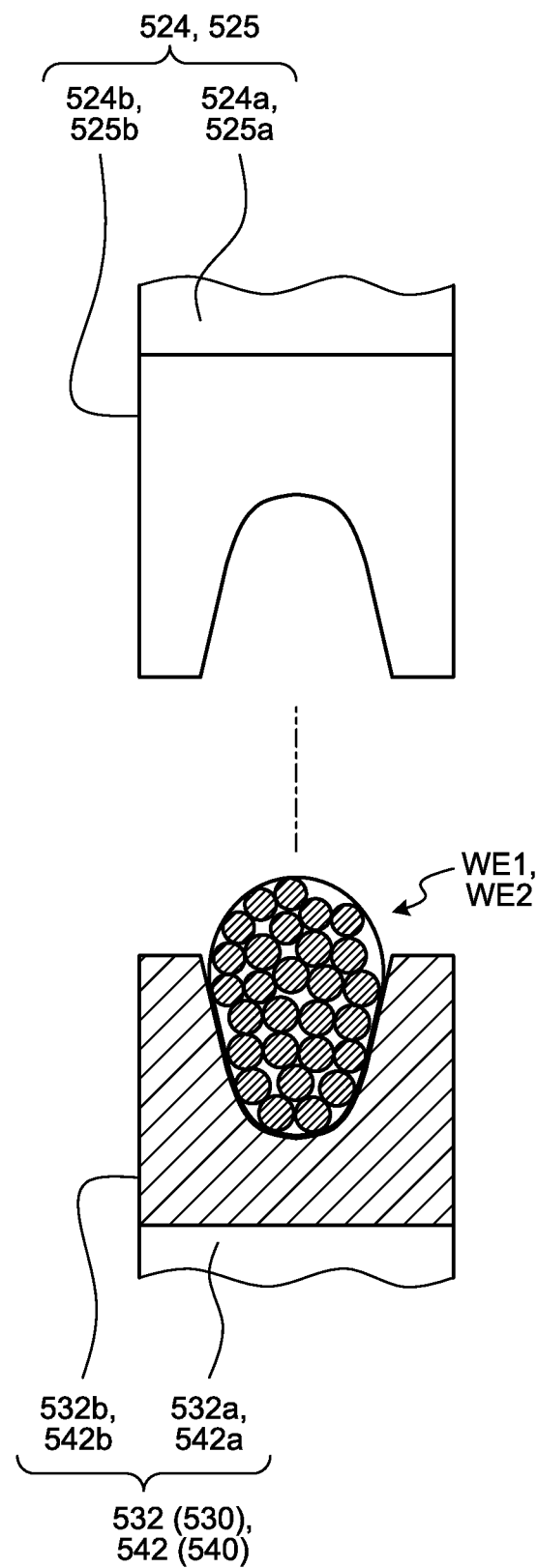
FIG. 19 is a cross-sectional view taken along Y-Y line of FIG. 17.

The first clamping body 524 has a piece 524*a* similar to that of the first clamping body 24 described above, and has a pressing portion 524*b* provided at a free end of the piece 524*a* to come into contact with and press the intermediate connection portion WE1*a* of the first electric wire WE1 (FIG. 17 and FIG. 18). The pressing portion 524*b* is formed in a U-shape. The pressing portion 524*b* is open to a side of the intermediate connection portion WE1*a* of the first electric wire WE1, and inserts the intermediate connection portion WE1*a* inward from the opening. In addition, the second clamping body 525 has a piece 525*a* similar to that of the second clamping body 25 described above, and has a pressing portion 525*b* provided at a free end of the piece 525*a* to come into contact with and press the intermediate connection portion WE2*a* of the second electric wire WE2 (FIG. 17 and FIG. 18). The pressing portion 525*b* is formed in a U-shape (FIG. 19). The pressing portion 525*b* is open to a side of the intermediate connection portion WE2*a* of the second electric wire WE2, and inserts the intermediate connection portion WE2*a* inward from the opening.

The first electric connection structure 530 includes a first circuit side connection body 532 without having the first electric wire side connection body 31 described above (FIG. 17 and FIG. 18). As in the previous example, the first circuit side connection body 532 is provided on a first circuit side connection member 512 having a main body 512*a* and a first circuit side connection body 512*b*, and uses the first circuit side connection body 512*b* (FIG. 17 and FIG. 18). The first circuit side connection body 532 has an elastic piece 532*a* similar to that of the first circuit side connection body 32 (12b) described above, and has a contact portion 532b provided at a free end of the elastic piece 532a and directly electrically connected to the intermediate connection portion WE1a of the first electric wire WE1 (FIG. 17 and FIG. 18). The contact portion 532b in this example has a U-shape (FIG. 19). The contact portion 532b is open to a side of the intermediate connection portion WE1a of the first electric wire WE1, and inserts the intermediate connection portion WE1a inward from the opening.

In addition, the second electric connection structure 540 includes a second circuit side connection body 542 without having the second electric wire side connection body 41 described above (FIG. 17 and FIG. 18). As in the previous example, the second circuit side connection body 542 is provided on a second circuit connection member 513 having a main body 513a and a second circuit side connection body 513b, and uses the second circuit side connection body 513b (FIG. 17 and FIG. 18). The second circuit side connection body 542 has an elastic piece 542a similar to that of the second circuit side connection body 42 (13b) described above, and has a contact portion 542b provided at a free end of the elastic piece 542a and directly electrically connected to the intermediate connection portion WE2a of the second electric wire WE2 (FIG. 17 and FIG. 18). The contact portion 542b in this example has a U-shape (FIG. 19). The contact portion 542b is open to a side of the intermediate connection portion WE2a of the second electric wire WE2, and inserts the intermediate connection portion WE2a inward from the opening.

That is, the first circuit side connection body 532 in this example is formed to be directly electrically connected to the intermediate connection portion WE1a of the first electric wire WE1. The first circuit side connection body 532 is directly electrically connected to the intermediate connection portion WE1a of the first electric wire WE1 by an elastic force directly applied to the intermediate connection portion WE1a. In addition, the first clamping body 524 in this example is formed to directly clamp the intermediate connection portion WE1a of the first electric wire WE1 between the first clamping body 524 and the contact portion 532b of the first circuit side connection body 532. In addition, the second circuit side connection body 42 in this example is formed to be directly electrically connected to the intermediate connection portion WE2a of the second electric wire WE2. The second circuit side connection body 42 is directly electrically connected to the intermediate connection portion WE2a of the second electric wire WE2 by an elastic force directly applied to the intermediate connection portion WE2a. In addition, the second clamping body 25 in this example is formed to directly clamp the intermediate connection portion WE2a of the second electric wire WE2 between the second clamping body 25 and the contact portion 42b of the second circuit side connection body 42.

When the first housing member 21 and the second housing member 22 are fit to each other, the pressing portion 524b and the contact portion 532b insert the intermediate connection portion WE1a of the first electric wire WE1 into the respective U-shapes inward from the respective openings (FIG. 20), and are disposed to face each other in the axial direction of the intermediate connection portion WE1a (FIG. 18). The pressing portion 524b and the contact portion 532b are disposed close to each other in the axial direction. In this way, the pressing portion 524b and the contact portion 532b can interpose the intermediate connection portion WE1a in the electric wire clamping direction by bottom portions of the respective U-shapes, and exert a stable contact load on the intermediate connection portion WE1a. In addition, the pressing portion 524b and the contact portion 532b can surround the intermediate connection portion WE1a of the first electric wire WE1 on the inner side of the respective U-shapes (FIG. 20). Therefore, in the noise filter 1F, the invention can be applied to the first electric wire WE1 in which the core wire WEa is a single wire, and can be applied to the first electric wire WE1 in which the core wire WEa is an aggregate of a plurality of strands since separation of the strands can be suppressed. In addition, the first electric wire WE1 may be obtained by welding and solidifying the plurality of strands in the intermediate connection portion WE1a described above using thermo-compression bonding, etc.

In addition, when the first housing member 21 and the second housing member 22 are fit to each other, the pressing portion 525b and the contact portion 542b insert the intermediate connection portion WE2a of the second electric wire WE2 into the respective U-shapes inward from the respective openings (FIG. 20), and are disposed to face each other in the axial direction of the intermediate connection portion WE2a (FIG. 18). The pressing portion 525b and the contact portion 542b are disposed close to each other in the axial direction. In this way, the pressing portion 525b and the contact portion 542b can interpose the intermediate connection portion WE2a in the electric wire clamping direction by bottom portions of the respective U-shapes, and exert a stable contact load on the intermediate connection portion WE2a. In addition, the pressing portion 525b and the contact portion 542b can surround the intermediate connection portion WE2a of the second electric wire WE2 on the inner side of the respective U-shapes (FIG. 20). Therefore, in the noise filter 1F, the invention can be applied to the second electric wire WE2 in which the core wire WEa is a single wire, and can be applied to the second electric wire WE2 in which the core wire WEa is an aggregate of a plurality of strands since separation of the strands can be suppressed. In addition, the second electric wire WE2 may be obtained by welding and solidifying the plurality of strands in the intermediate connection portion WE2a described above using thermo-compression bonding, etc.

In this way, since the number of parts is reduced in the first electric connection structure 530 and the second electric connection structure 540, the noise filter 1F can attempt weight reduction, improvement in assembling workability, and cost reduction.

Modification of Noise Filter 1A

Incidentally, in the noise filter 1A described above, although not illustrated, the respective contact portions 32b and 42b may be formed to have pressure welding blades disposed to face each other at an interval. A slit is formed in the coating WEb of the first electric wire WE1 inserted therebetween, and the pressure welding blade of the contact portion 32b is wedged into the core wire WEa of the first electric wire WE1. Therefore, the contact portion 32b can pressure-weld and fix the first electric wire WE1 in an electrically connected state by each pressure welding blade. In addition, a slit is formed in the coating WEb of the second electric wire WE2 inserted therebetween, and the pressure welding blade of the contact portion 42b is wedged into the core wire WEa of the second electric wire WE2. Therefore, the contact portion 42b can pressure-weld and fix the second electric wire WE2 in an electrically connected state by each pressure welding blade.

As described above, in the noise filter 1 (1A, 1B, 1C, 1D, 1E, and 1F) of the present embodiment, the filter circuit 10 is interposed between the intermediate connection portion WE1a of the first electric wire WE1 and the intermediate connection portion WE2a of the second electric wire WE2 bundled in the trunk line WT of the wire harness WH, and the filter circuit 10 is electrically connected to the respective intermediate connection portions WE1a and WE2a. Therefore, the noise filter 1 (1A, 1B, 1C, 1D, 1E, and 1F) of the present embodiment becomes a simple noise filter not requiring adjustment of the filter circuit characteristic taking the noise component of the intermediate electric wire into consideration unlike the past. Furthermore, the noise filter 1 (1A, 1B, 1C, 1D, 1E, and 1F) of the present embodiment may not use a ground terminal, and thus can attempt reduction in size or weight of the frame. Further, the noise filter 1 (1A, 1B, 1C, 1D, 1E, and 1F) of the present embodiment uses elasticity for electric connection between the first electric wire WE1 and the second electric wire WE2, and the filter circuit 10, and thus can attempt reduction in size of the frame and suppression of a steep rise in cost and becomes a noise filter having high versatility which can cope with electric wires having various outer diameters (the first electric wire WE1 and the second electric wire WE2). In addition, the noise filter 1 (1A, 1B, 1C, 1D, 1E, and 1F) of the present embodiment can absorb a dimensional variation of each component and exert a stable contact load on the intermediate connection portion WE1a of the first electric wire WE1 and the intermediate connection portion WE2a of the second electric wire WE2 by such a connection structure using elasticity, thereby attempting improvement in the conduction quality. In addition, the wire harness WH of the present embodiment includes such a noise filter 1 (1A, 1B, 1C, 1D, 1E, and 1F), and can achieve an effect obtained by this noise filter 1 (1A, 1B, 1C, 1D, 1E, and 1F).

Incidentally, in the noise filter 1 (1A, 1B, 1C, 1D, 1E, and 1F) of the present embodiment, the filter circuit 10 is interposed between the first electric wire WE1 and the second electric wire WE2 in illustration. Thus, in illustration, elasticity is used for both the electric connection structure between the first electric wire WE1 and the filter circuit 10 and the electric connection structure between the second electric wire WE2 and the filter circuit 10 (first and second electric connection structures). However, in the noise filter 1 (1A, 1B, 1C, 1D, 1E, and 1F) according to the present embodiment, elasticity may be used for one of the connection structures, and the other one may be configured as another connection structure.

In a noise filter according to the embodiment, an electric connection structure between an intermediate connection portion of an electric wire and a circuit side connection body uses an elastic force of the circuit side connection body. Therefore, when compared to a noise filter in which a connection structure corresponds to a fitting structure of male and female terminal portions as in the past, this noise filter can achieve a reduction in size of an electric connection structure. Therefore, this noise filter can attempt a reduction in size of a frame. In addition, a wire harness according to the invention includes such a noise filter, and can achieve an effect obtained by this noise filter.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A noise filter comprising:
a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected; and
an electric connection structure that electrically connects an intermediate connection portion of a core wire of an electric wire to one of the first circuit connection member and the second circuit connection member, wherein
the electric connection structure includes a circuit side connection body provided in the one of the first circuit connection member and the second circuit connection member and indirectly or directly electrically connected to the intermediate connection portion of the core wire of the electric wire by an elastic force indirectly or directly exerted on the intermediate connection portion of the core wire of the electric wire, and the elastic force biases the circuit side connection body away from the one of the first circuit connection member and the second circuit connection member.

2. The noise filter according to claim 1, wherein
the electric connection structure includes an electric wire side connection body physically and electrically connected to the intermediate connection portion of the core wire of the electric wire, and
the circuit side connection body is formed to be indirectly electrically connected to the intermediate connection portion of the core wire of the electric wire by an elastic force exerted on the electric wire side connection body.

3. The noise filter according to claim 1, wherein
the intermediate connection portion of the core wire of the electric wire is a part obtained by collectively fixing a plurality of strands forming the core wire of the electric wire, and
the circuit side connection body is formed to be directly electrically connected to the intermediate connection portion by an elastic force exerted on the intermediate connection portion of the core wire of the electric wire.

4. A noise filter comprising:
a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected; and
an electric connection structure that electrically connects an intermediate connection portion of a core wire of an electric wire to one of the first circuit connection member and the second circuit connection member; and
a housing that accommodates the filter circuit, the intermediate connection portion of the core wire of the electric wire, and the electric connection structure,
the electric connection structure includes a circuit side connection body provided in one of the first circuit connection member and the second circuit connection member and indirectly or directly electrically connected to the intermediate connection portion of the core wire of the electric wire by an elastic force indirectly or directly exerted on the intermediate connection portion of the core wire of the electric wire, and
wherein the housing has a clamping body that indirectly or directly clamps the intermediate connection portion of the core wire of the electric wire between the circuit side connection body and the clamping body.

5. The noise filter according to claim 4, wherein
the electric connection structure includes an electric wire side connection body physically and electrically connected to the intermediate connection portion of the core wire of the electric wire, and
the circuit side connection body is formed to be indirectly electrically connected to the intermediate connection portion of the core wire of the electric wire by an elastic force exerted on the electric wire side connection body.

6. The noise filter according to claim 4, wherein
the intermediate connection portion of the core wire of the electric wire is a part obtained by collectively fixing a plurality of strands forming the core wire of the electric wire, and
the circuit side connection body is formed to be directly electrically connected to the intermediate connection portion by an elastic force exerted on the intermediate connection portion of the core wire of the electric wire.

7. A wire harness comprising:
a trunk line including an electric wire; and
a noise filter that reduces a noise component, wherein
the noise filter includes
a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected, and
an electric connection structure that electrically connects an intermediate connection portion of a core wire of the electric wire to one of the first circuit connection member and the second circuit connection member, and
the electric connection structure includes a circuit side connection body provided in one of the first circuit connection member and the second circuit connection member and indirectly or directly electrically connected to the intermediate connection portion of the core wire of the electric wire by an elastic force indirectly or directly exerted on the intermediate connection portion of the core wire of the electric wire, and
the elastic force biases the circuit side connection body away from the one of the first circuit connection member and the second circuit connection member.

* * * * *